(12) United States Patent
Choi et al.

(10) Patent No.: US 12,022,212 B2
(45) Date of Patent: Jun. 25, 2024

(54) IMAGE SENSOR AND IMAGE SENSING SYSTEM

(71) Applicant: Samsung Electronics Co., Ltd., Suwon-si (KR)

(72) Inventors: Ha Na Choi, Seongnam-si (KR); Hong Hyun Jeon, Suwon-si (KR); Ji Eun Lee, Suwon-si (KR); Won Chul Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 17/571,682

(22) Filed: Jan. 10, 2022

(65) Prior Publication Data

US 2022/0337764 A1 Oct. 20, 2022

(30) Foreign Application Priority Data

Apr. 19, 2021 (KR) .......................... 10-2021-0050317

(51) Int. Cl.
*H04N 25/46* (2023.01)
*H01L 23/00* (2006.01)
(Continued)

(52) U.S. Cl.
CPC .............. *H04N 25/46* (2023.01); *H01L 24/08* (2013.01); *H01L 27/14621* (2013.01); *H01L 27/14627* (2013.01); *H01L 27/1463* (2013.01); *H01L 27/14634* (2013.01); *H01L 27/14636* (2013.01); *H01L 27/1464* (2013.01);
(Continued)

(58) Field of Classification Search
CPC ........ H04N 25/46; H04N 25/11; H04N 25/75; H04N 25/134; H04N 25/59; H01L 24/08; H01L 27/14621; H01L 27/14627; H01L 27/1463; H01L 27/14634; H01L 27/14636; H01L 27/1464; H01L 27/14645; H01L 2224/08145; H01L 24/80; H01L 27/14605;
(Continued)

(56) References Cited

U.S. PATENT DOCUMENTS 8,786,731 B2 7/2014 Kasai
8,964,087 B2 2/2015 Kurahashi et al.
(Continued)

*Primary Examiner* — Lin Ye
*Assistant Examiner* — Tuan H Le
(74) *Attorney, Agent, or Firm* — HARNESS, DICKEY & PIERCE, P.L.C.

(57) ABSTRACT

An image sensor includes a pixel group. The pixel group includes a first color filter, first to third photodiodes below the first color filter such that the first color filter overlaps each of the first to third third photodiodes in a vertical direction, wherein the first to third photodiodes are arranged in a first direction perpendicular to the vertical direction, first to third floating diffusions configured to accumulate electric charges generated by the first to third photodiodes, respectively, a source follower transistor configured to output a first pixel signal based on the electric charges accumulated in at least one of the first to third floating diffusions, and a first metal layer configured to receive the first pixel signal from the source follower transistor, wherein the first metal layer extends in a second direction intersecting the first direction, wherein the first to third floating diffusions are arranged in the first direction.

19 Claims, 20 Drawing Sheets

(51) Int. Cl.
*H01L 27/146* (2006.01)
*H04N 25/11* (2023.01)
*H04N 25/75* (2023.01)

(52) U.S. Cl.
CPC ....... *H01L 27/14645* (2013.01); *H04N 25/11* (2023.01); *H04N 25/75* (2023.01); *H01L 2224/08145* (2013.01)

(58) Field of Classification Search
CPC ......... H01L 27/14614; H01L 27/14618; H01L 27/14603
See application file for complete search history.

(56) References Cited

U.S. PATENT DOCUMENTS

| | | |
|---|---|---|
| 9,749,556 B2 | 8/2017 | Fettig et al. |
| 10,027,918 B2 | 7/2018 | Ono |
| 10,547,800 B2 | 1/2020 | Hwang et al. |
| 10,797,090 B2 | 10/2020 | Perkins et al. |
| 2014/0009655 A1* | 1/2014 | Hayashi ............... H04N 25/134 348/302 |
| 2016/0307948 A1* | 10/2016 | Stark .................. H01L 27/14641 |
| 2017/0171470 A1* | 6/2017 | Sakioka ............... H04N 25/135 |
| 2019/0238776 A1* | 8/2019 | Kim .......................... G06T 7/90 |
| 2020/0314362 A1 | 10/2020 | Roh et al. |
| 2021/0175270 A1* | 6/2021 | Pang ................. H01L 27/14605 |
| 2021/0203872 A1* | 7/2021 | Chen ...................... H04N 23/60 |
| 2021/0337169 A1* | 10/2021 | Chen ...................... H04N 25/46 |

* cited by examiner

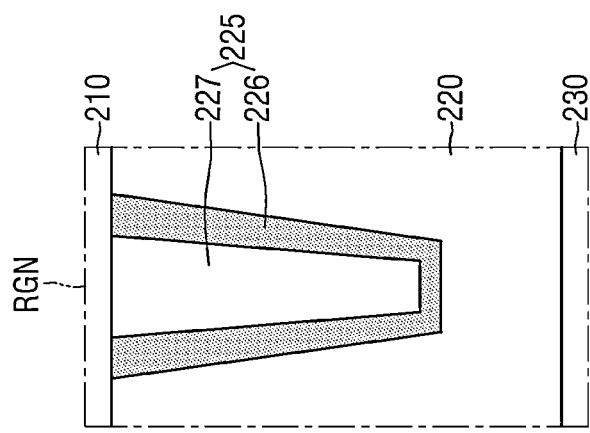

PA"

| NGG1" | NWG1" | NRG1" | NWG3" |
| NWG2" | NGG2" | NWG4" | NRG2" |
| NBG1" | NWG5" | NGG3" | NWG7" |
| NWG6" | NBG2" | NWG8" | NGG4" |

IMAGE SENSOR AND IMAGE SENSING SYSTEM

CROSS-REFERENCE TO RELATED APPLICATION

This application claims priority from Korean Patent Application No. 10-2021-0050317 filed on Apr. 19, 2021 in the Korean Intellectual Property Office, and all the benefits accruing therefrom under 35 U.S.C. § 119, the contents of which in its entirety are herein incorporated by reference.

BACKGROUND

1. Field

The present inventive concepts relate to image sensors and image sensing systems.

2. Description of the Related Art

An image sensing device is one of semiconductor elements that convert optical information into an electric signal. Such an image sensing device may include a charged coupled device (CCD) image sensing device and a complementary metal-oxide semiconductor (CMOS) image sensing device.

The CMOS image sensor may be abbreviated as a CIS (CMOS Image Sensor). The CIS may have a plurality of pixels arranged two-dimensionally. Each of the pixels may include, for example, a photodiode (PD). The photodiode may serve to convert incident light into electrical signals.

Recently, with the development of the computer industry and the telecommunication industry, demands for image sensors with improved performance in various fields, such as a digital camera, a video camera, a smart phone, a game machine, a security camera, a medical micro camera and a robot, have increased.

SUMMARY

Aspects of the present inventive concepts provide an image sensor in which the image quality of an image is improved.

However, aspects of the present inventive concepts are not restricted to the example embodiments set forth herein. The and other aspects of the present inventive concepts will become more apparent to one of ordinary skill in the art to which the present inventive concepts pertains by referencing the detailed description of the present inventive concepts given below.

According to some example embodiments of the present inventive concepts, an image sensor may include a pixel group, wherein the pixel group includes a first color filter, a first photodiode, a second photodiode, and a third photodiode that are below the first color filter such that the first color filter overlaps each of the first, second, and third photodiodes in a vertical direction, wherein the first, second, and third photodiodes are arranged in a first direction that is perpendicular to the vertical direction, a first floating diffusion configured to accumulate electric charges generated by the first photodiode, a second floating diffusion configured to accumulate electric charges generated by the second photodiode, a third floating diffusion configured to accumulate electric charges generated by the third photodiode, a source follower transistor configured to output a first pixel signal based on the electric charges accumulated in at least one of the first to third floating diffusions, and a first metal layer configured to receive the first pixel signal from the source follower transistor, wherein the first metal layer extends in a second direction intersecting the first direction, wherein the first to third floating diffusions are arranged in the first direction.

According to some example embodiments of the present inventive concepts, an image sensor may include a first pixel group which includes a first color filter, and first pixels below the first color filter in a form of N*M along a first direction and a second direction such that the first color filter overlaps the first pixels in a vertical direction, a first floating diffusion shared by at least a portion of the first pixels that are arranged in the first direction, and a first column line which is connected to the first pixel group, wherein the first column line extends in the second direction, and the first column line is configured to receive a first pixel signal based on an amount of electric charges accumulated in the first floating diffusion, wherein the first direction intersects the second direction, and N and M are separate integers that are each 3 or more.

According to some example embodiments of the present inventive concepts, an image sensing system may include an image sensor which includes a pixel group and a readout circuit connected to the pixel group, and an image signal processor connected to the image sensor, wherein the pixel group includes a first color filter, a first photodiode, a second photodiode, and a third photodiode that are below the first color filter such that the first color filter overlaps each of the first, second, and third photodiodes in a vertical direction, wherein the first, second, and third photodiodes are arranged in a first direction that is perpendicular to the vertical direction, a first floating diffusion configured to accumulate electric charges generated by the first photodiode, a second floating diffusion configured to accumulate electric charges generated by the second photodiode, a third floating diffusion configured to accumulate electric charges generated by the third photodiode, a source follower transistor configured to output a first pixel signal based on the electric charges accumulated in at least one of the first to third floating diffusions, and a first metal layer configured to receive the first pixel signal from the source follower transistor, wherein the first metal layer extends in a second direction intersecting the first direction, wherein the first to third floating diffusions are arranged in the first direction, wherein the readout circuit is configured to perform an analog binning operation on the first pixel signal received from the first metal layer to output a first image signal, and wherein the image signal processor is configured to perform a digital binning operation on the first image signal received from the readout circuit to output a second image signal.

BRIEF DESCRIPTION OF THE DRAWINGS

Hereinafter, some example embodiments according to the technical idea of the present inventive concepts will be described with reference to the accompanying drawings.

FIGS. 6A and 6B are enlarged views of a region RGN of FIG. 5 according to some example embodiments.

DETAILED DESCRIPTION

Figure 1:
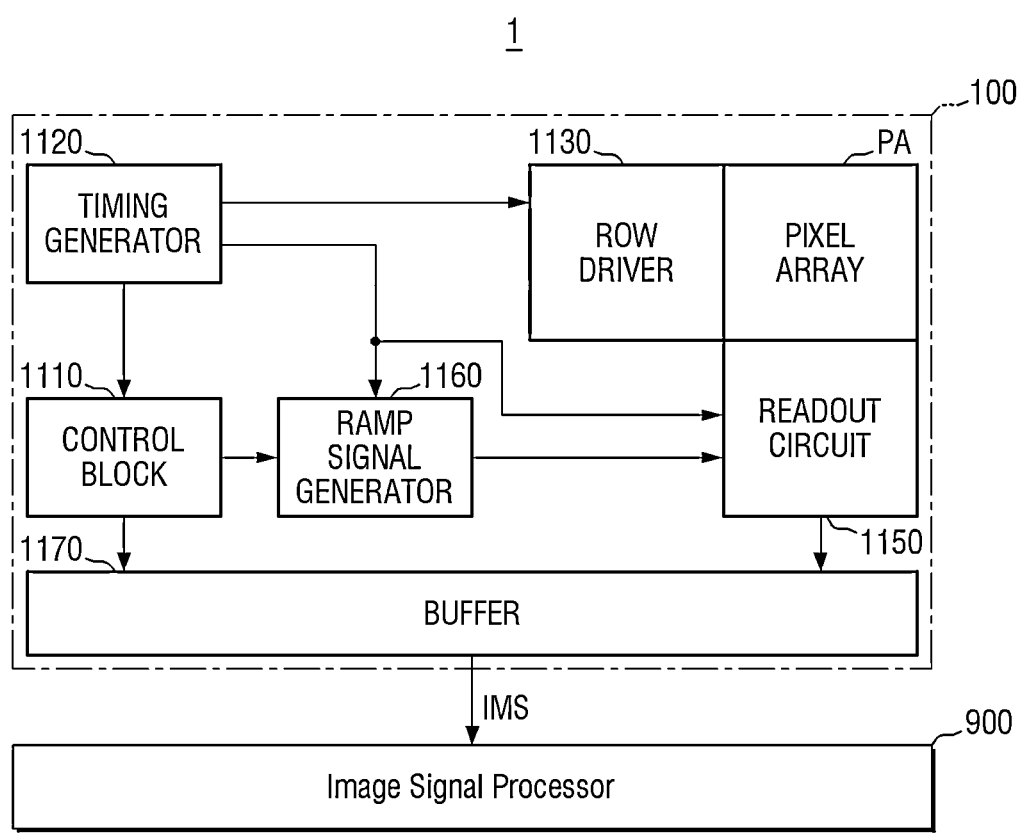
FIG. 1 is a block diagram of an image sensing device according to some example embodiments.

Hereinafter, some example embodiments according to the technical idea of the present inventive concepts will be described referring to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a block diagram of an image sensing device according to some example embodiments.

Referring to FIG. 1, the image sensing device 1 may include an image sensor 100 and an image signal processor 900 that is connected to the image sensor 100.

The image sensor 100 may generate an image signal IMS by sensing an image to be sensed using light. In some example embodiments, although the generated image signal IMS may be, for example, a digital signal, the example embodiments according to the technical idea of the present inventive concepts are not limited thereto.

The image signal IMS may be provided to the image signal processor 900 and processed therein. The image signal processor 900 receives the image signal IMS that is output from a buffer 1170 of the image sensor 100, and may process or treat the received image signal IMS to be easily displayed.

In some example embodiments, the image signal processor 900 may perform digital binning on the image signal IMS that is output from the image sensor 100. At this time, the image signal IMS that is output from the image sensor 100 may be a raw image signal from the pixel array PA without analog binning, and may also be an image signal IMS on which analog binning has already been performed.

In some example embodiments, the image sensor 100 and the image signal processor 900 may be placed separately from each other as shown. For example, the image sensor 100 may be mounted on a first chip and the image signal processor 900 may be mounted on a second chip to communicate with each other through a predetermined interface. However, the example embodiments are not limited thereto, and the image sensor 100 and the image signal processor 900 may be implemented as a single package, for example, a MCP (multi-chip package).

The image sensor 100 may include a control register block 1110, a timing generator 1120, a row driver 1130, a pixel array PA, a readout circuit 1150, a ramp signal generator 1160, and a buffer 1170.

The control register block 1110 may generally control the operation of the image sensor 100. In particular, the control register block 1110 may directly transmit an operation signal to the timing generator 1120, the ramp signal generator 1160 and the buffer 1170.

The timing generator 1120 may generate a signal that serves as a reference for the operation timing of a plurality of components of the image sensor 100. The operating timing reference signal generated by the timing generator 1120 may be sent to the row driver 1130, the readout circuit 1150, the ramp signal generator 1160, and the like.

The ramp signal generator 1160 may generate and transmit the ramp signal used in the readout circuit 1150. For example, the readout circuit 1150 may include a correlated double sampler (CDS), a comparator, or the like. The ramp signal generator 1160 may generate and transmit the ramp signal used in the correlated double sampler (CDS), the comparator, or the like.

The buffer 1170 may include, for example, a latch. The buffer 1170 may temporarily store the image signal IMS to be provided to the outside, and may transmit the image signal IMS to an external memory or an external device. The buffer 1170 may include, for example, an eMRAM (embedded MRAM) or the like. However, the example embodiments according to the technical idea of the present inventive concepts are not limited thereto, and the buffer 1170 may include a memory such as a DRAM or a SRAM.

The pixel array PA may sense external images. The pixel array PA may include a plurality of pixels (or unit pixels). The row driver 1130 may selectively activate the row of the pixel array PA.

The readout circuit 1150 may sample the pixel signal provided from the pixel array PA, compare the pixel signal to the ramp signal, and then convert an analog image signal (data) into a digital image signal (data) on the basis of the results of the comparison.

Figure 2:
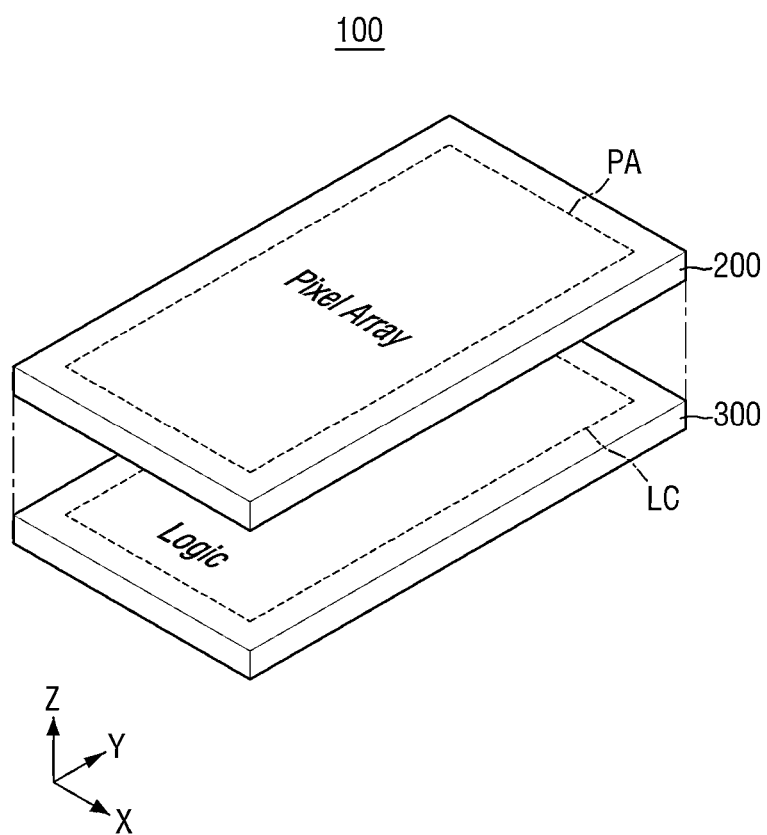
FIG. 2 is a diagram showing a conceptual layout of the image sensor according to some example embodiments.

FIG. 2 is a diagram showing a conceptual layout of the image sensor according to some example embodiments.

Referring to FIG. 2, the image sensor 100 of some example embodiments may include an upper chip 200 and a lower chip 300 which are stacked. A plurality of pixels may be placed on the upper chip 200 in a two-dimensional array structure. That is, the upper chip 200 may include a pixel array PA. The lower chip 300 may include a logic region LC, a memory region, and the like. The lower chip 300 is placed below the upper chip 200 and may be electrically connected to the upper chip 200. The lower chip 300 may allow the pixel signal sent from the upper chip 200 to be sent to the logic region LC of the lower chip 300.

Logic elements may be placed in the logic region LC of the lower chip 300. The logic elements may include circuits for processing a pixel signal from the pixel. For example, the logic elements may include the control register block 1110, the timing generator 1120, the row driver 1130, the readout circuit 1150, the ramp signal generator 1160 and the like of FIG. 1.

Figure 3:
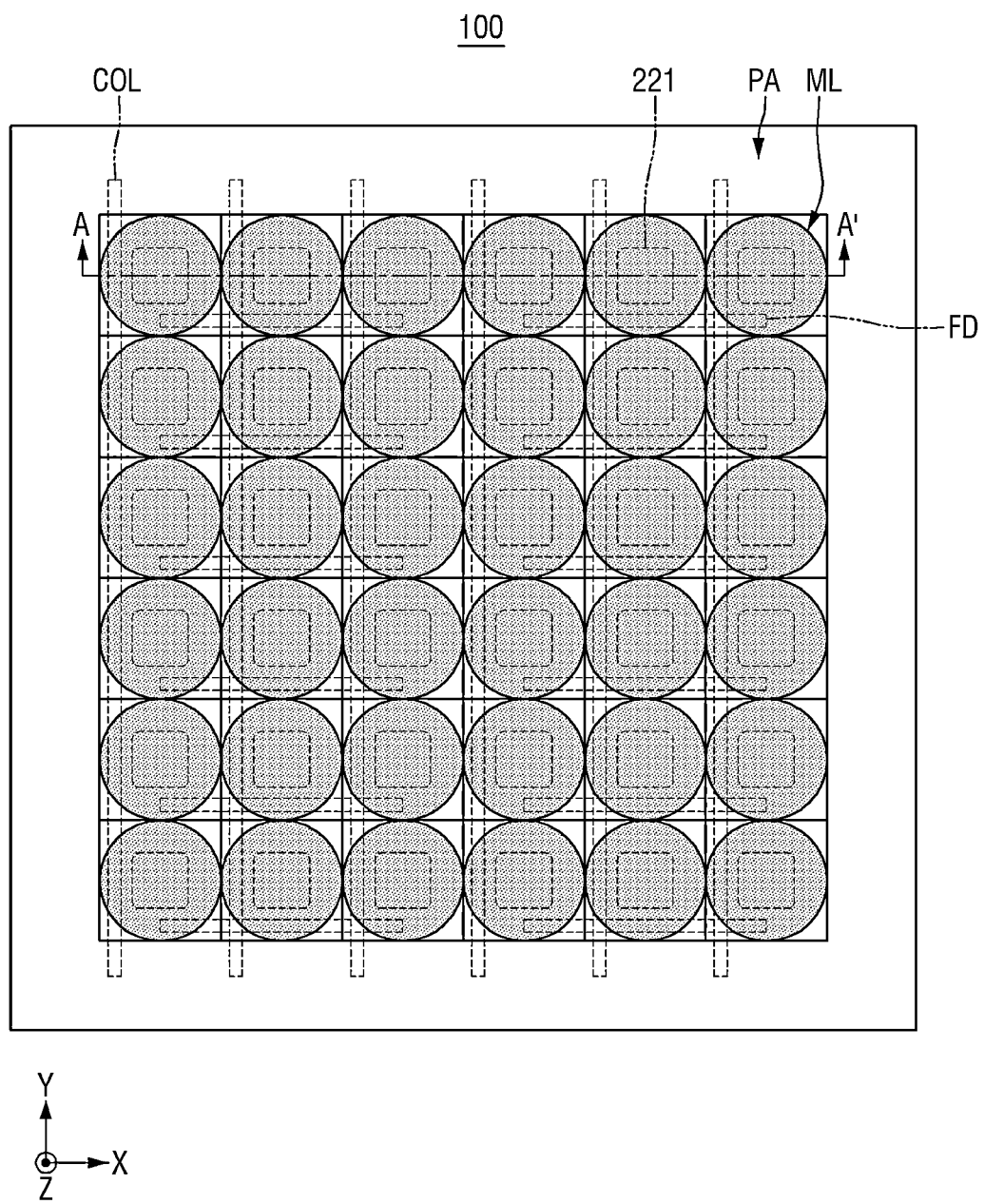
FIG. 3 is a top view of the image sensor according to some example embodiments.

FIG. 3 is a top view of the image sensor according to some example embodiments.

Figure 4:
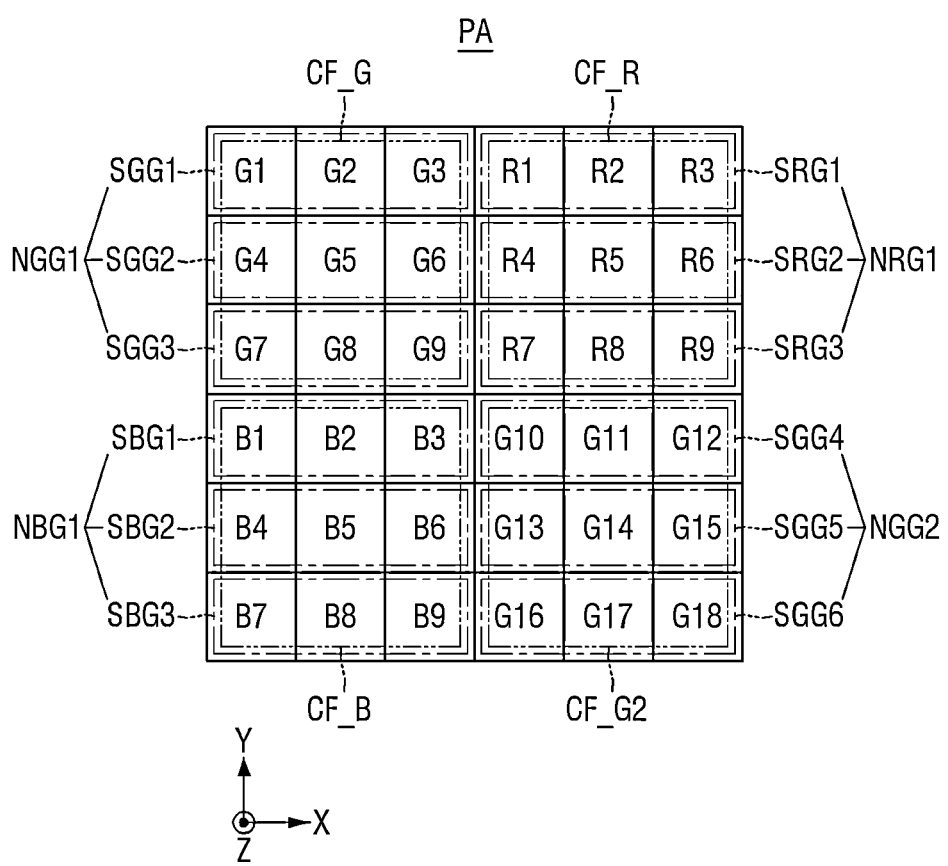
FIG. 4 is a diagram for explaining the pixel array of FIG. 3 according to some example embodiments.
Figure 5:
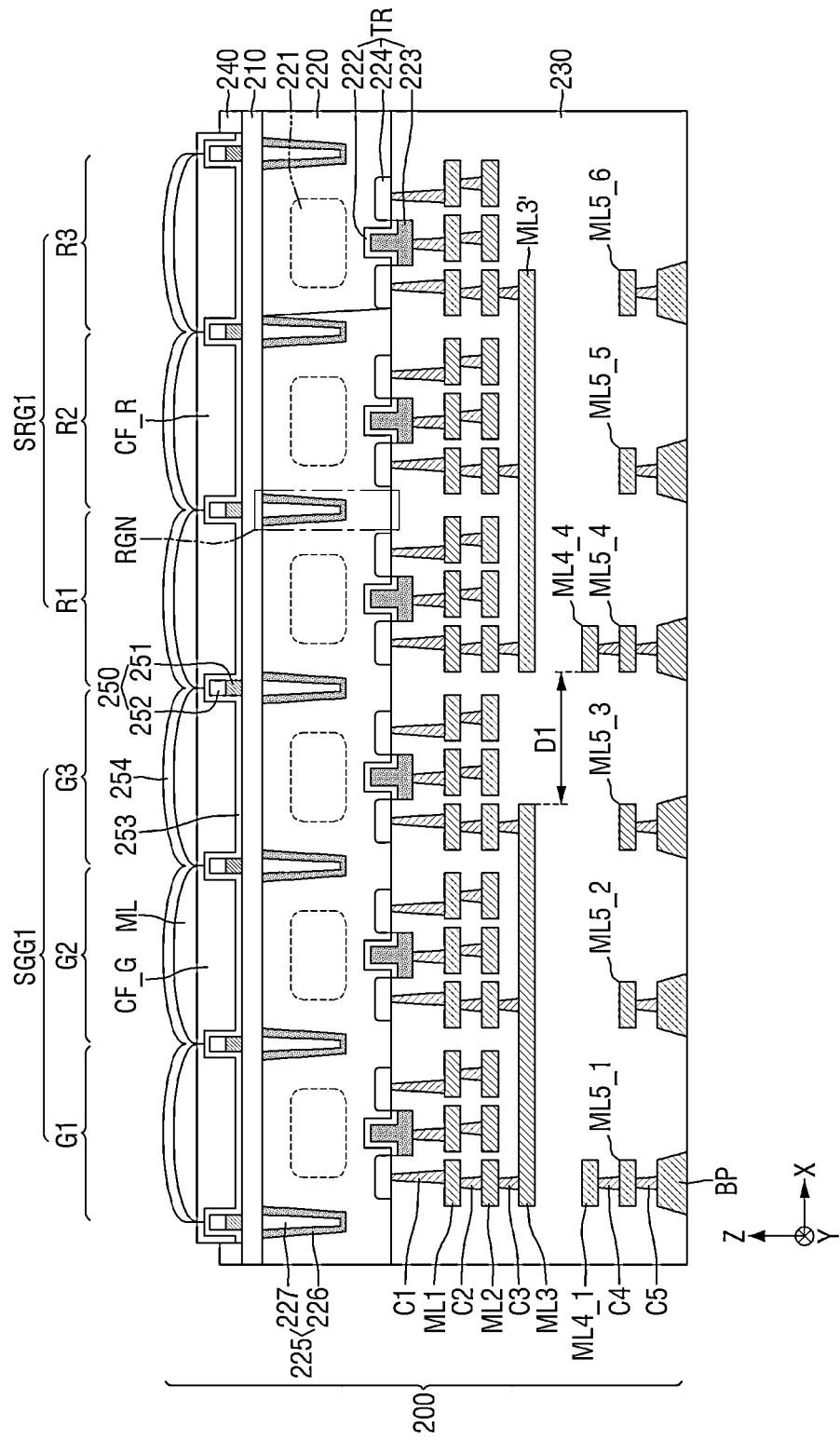
FIG. 5 is a cross-sectional view of the image sensor taken along A-A' of FIG. 3 according to some example embodiments.

FIG. 4 is a diagram for explaining the pixel array of FIG. 3 according to some example embodiments. FIG. 5 is a cross-sectional view of the image sensor taken along A-A' of FIG. 3 according to some example embodiments.

Referring to FIG. 3, the pixel array PA may be placed on the upper surface of the image sensor 100. Specifically, the pixel array PA may be placed on the upper surface of the upper chip 200 of the image sensor 100. The pixel array PA may include a plurality of microlenses ML, a plurality of floating diffusions FD, a plurality of photoelectric conversion layers 221, a plurality of column lines COL, and the like. Here, the microlens ML and the photoelectric conversion layer 221 may be formed for each pixel of the pixel array PA.

Referring to FIG. 4, the pixel array PA may include a first nona green pixel group NGG1, a first nona red pixel group NRG1, a first nona blue pixel group NBG1, and a second nona green pixel group NGG2. FIG. 4 shows only a partial pixel array PA as an example, and the pixel array may include more pixels. The first nona red pixel group NRG1 may be placed in a first direction X from the first nona green pixel group NGG1, and the first nona blue pixel group NBG1 may be placed in a direction opposite to the second direction Y from the first nona green pixel group NGG1. The first nona green pixel group NGG1, the first nona red pixel group NRG1, the first nona blue pixel group NBG1 and the second nona green pixel group NGG2 may be in contact with each other. For example, the second nona green pixel group NGG2 may be in contact with the first nona red pixel group NRG1 and the first nona blue pixel group NBG1. It will be understood that the term "nona," when used to refer to a pixel group (e.g., nona green pixel group, nona red pixel group, nona blue pixel group, etc.), may refer to a pixel group that includes nine pixels.

The first nona green pixel group NGG1 may include a first shared green pixel group SGG1, a second shared green pixel group SGG2, and a third shared green pixel group SGG3. The first shared green pixel group SGG1 may include a first green pixel G1, a second green pixel G2 and a third green pixel G3 arranged along the first direction X. The second shared green pixel group SGG2 may include a fourth green pixel G4, a fifth green pixel G5 and a sixth green pixel G6 arranged along the first direction X. The third shared green pixel group SGG3 may include a seventh green pixel G7, an eighth green pixel G8 and a ninth green pixel G9 arranged along the first direction X. The first shared green pixel group SGG1, the second shared green pixel group SGG2, and the third shared green pixel group SGG3 may be arranged along the second direction Y. Here, the second direction Y may be a direction that intersects the first direction X.

The first nona red pixel group NRG1 may include a first shared red pixel group SRG1, a second shared red pixel group SRG2, and a third shared red pixel group SRG3. The first shared red pixel group SRG1 may include a first red pixel R1, a second red pixel R2 and a third red pixel R3 arranged along the first direction X. The second shared red pixel group SRG2 may include a fourth red pixel R4, a fifth red pixel R5 and a sixth red pixel R6 arranged along the first direction X. The third shared red pixel group SRG3 may include a seventh red pixel R7, an eighth red pixel R8 and a ninth red pixel R9 arranged along the first direction X. The first shared red pixel group SRG1, the second shared red pixel group SRG2, and the third shared red pixel group SRG3 may be arranged along the second direction Y.

The first nona blue pixel group NBG1 may include a first shared blue pixel group SBG1, a second shared blue pixel group SBG2, and a third shared blue pixel group SBG3. The first shared blue pixel group SBG1 may include a first blue pixel B1, a second blue pixel B2 and a third blue pixel B3 arranged along the first direction X. The second shared blue pixel group SBG2 may include a fourth blue pixel B4, a fifth blue pixel B5, and a sixth blue pixel B6 arranged along the first direction X. The third shared blue pixel group SBG3 may include a seventh blue pixel B7, an eighth blue pixel B8 and a ninth blue pixel B9 arranged along the first direction X. The first shared blue pixel group SBG1, the second shared blue pixel group SBG2, and the third shared blue pixel group SBG3 may be arranged along the second direction Y.

The second nona green pixel group NGG2 may include a fourth shared green pixel group SGG4, a fifth shared green pixel group SGG5, and a sixth shared green pixel group SGG6. The fourth shared green pixel group SGG4 may include a tenth green pixel G10, an eleventh green pixel G11 and a twelfth green pixel G12 arranged along the first direction X. The fifth shared green pixel group SGG5 may include a thirteenth green pixel G13, a fourteenth green pixel G14, and a fifteenth green pixel G15 arranged along the first direction X. The sixth shared green pixel group SGG6 may include a sixteenth green pixel G16, a seventeenth green pixel G17 and an eighteenth green pixel G18 arranged along the first direction X. The fourth shared green pixel group SGG4, the fifth shared green pixel group SGG5 and the sixth shared green pixel group SGG6 may be arranged along the second direction Y.

That is, the pixel array PA may correspond to a nona pattern pixel array. A single pixel group may include nine pixels. The nine pixels may share a color filter having one color (e.g., a color filter configured to selectively filter and/or transmit light having a particular color, light within a particular wavelength spectrum that is associated with a particular color, etc.). A color filter described as "having" or "selectively transmitting" a color will be understood to be configured to selectively filter and/or selectively transmit light having a particular color, light within a particular wavelength spectrum that is associated with a particular color, etc.

As shown in at least FIGS. 4-5, a pixel group (e.g., first nona green pixel group NGG1) may include a first color filter (e.g., green color filter CF_G, which may selectively transmit green light) and pixels (e.g., first to ninth green pixels G1 to G9) that are below the first color filter in a form of N*M along first and second directions X and Y (e.g., an array), where N and M are separate integers that are each 3 or more, where the color filter (e.g., CF_G) overlaps the pixels (e.g., G1 to G9) in a vertical direction (e.g., Z-direction).

Additionally, as shown in at least FIGS. 4-5 and 7-8, a second pixel group (e.g., first nona blue pixel group NBG1) may include a second color filter (e.g., blue color filter CF_B, which may selectively transmit blue light) configured to selectively transmit a color different from the first color filter (e.g., CF_G, which may selectively transmit green light), and second pixels (e.g., first to ninth blue pixels B1 to B9) below the second color filter in a form of N*M along the first direction X and the second direction Y such that the second color filter (e.g., CF_B) overlaps the second pixels (e.g., B1 to B9) in the vertical direction (e.g., Z-direction), wherein the second pixel group (e.g., NBG1) is offset from the first pixel group (e.g., NGG1) in the second direction Y.

Additionally, as shown in at least FIGS. 4-5 and 7-8, a third pixel group (e.g., first nona red pixel group NRG1) may include a third color filter (e.g., red color filter CF_R) configured to selectively transmit a color (e.g., red light) different from the colors that the first and second color filters (e.g., CF_G and CF_B) are collectively configured to selectively transmit, and third pixels (e.g., first to ninth red pixels R1 to R9) below the third color filter in a form of N*M along the first direction X and the second direction Y such that the third color filter (e.g., CF_R) overlaps the third pixels (e.g., R1 to R9) in the vertical direction (e.g., Z-direction), wherein the third pixel group (e.g., NRG1) is offset from the first pixel group (e.g., NGG1) in the first direction X.

Additionally, as shown in at least FIGS. 4-5 and 7-8, a fourth pixel group (e.g., second nona green pixel group NGG2) may include a fourth color filter (e.g., second green color filter CF_G2) configured to selectively transmit a color (e.g., green light) different from the colors that the second and third color filters (e.g., CF_B and CF_R) are collectively configured to selectively transmit (e.g., blue and red light), and fourth pixels (e.g., tenth to eighteenth green pixels G10 to G18) below the fourth color filter in a form of N*M along the first direction X and the second direction Y such that the fourth color filter (e.g., CF_G2) overlaps the fourth pixels (e.g., G10 to G18) in the vertical direction (e.g., Z-direction), wherein the fourth pixel group (e.g., NGG2) is offset from the third pixel group (e.g., NRG1) in the second direction Y.

The first to fourth color filters (e.g., CF_G, CF_B, CF_R, CF_G2) may be configured have one of red, green, blue, or white colors, and thus may be understood to be configured to selectively filter or transmit one of red light, green light, blue light, or white light.

The image sensor 100 may receive an image signal that is output from the single pixel group and perform the image signal processing.

Referring to FIGS. 3 and 4, the single pixel may include one microlens ML and one photoelectric conversion layer 221. For example, the first green pixel G1 may include one microlens ML at the top and one photoelectric conversion layer 221 inside. Accordingly, and as shown in at least FIGS. 3 and 5, it will be understood that, where the first nona green pixel group NGG1 includes multiple microlenses ML, the microlenses ML may each cover (e.g., at least partially or completely overlap in the vertical direction or Z-direction) a separate photodiode (e.g., as at least partially defined by a photoelectric conversion layer 221 in a respective pixel) of the photodiodes of the separate pixels (e.g., first to ninth green pixels G1 to G9) of the pixel group. A column line COL may be formed by extending in the second direction Y. That is, the column line COL may extend in the second direction Y along a plurality of pixels. The column line COL may be connected to a plurality of pixels, and the pixels may output a pixel signal to the column line COL. For example, the first green pixel G1, the fourth green pixel G4, the seventh green pixel G7, the first blue pixel B1, the fourth blue pixel B4 and the seventh blue pixel B7 may share the single column line COL.

Floating diffusion FD may be formed by extending in the first direction X along the plurality of pixels. That is, the floating diffusion FD may be shared by the single pixel group. For example, the floating diffusion FD may be shared by the first shared green pixel group SGG1. That is, three pixels (e.g., first to third green pixels G1 to G3) may share the single floating diffusion FD. For example, as shown in at least FIGS. 4, 5, and 7-8, where the first nona green pixel group NGG1 includes pixels (e.g., G1 to G9) in an array along the first and second directions X and Y, a first floating diffusion FD1 may be shared by at least a portion of the pixels that are arranged in the first direction X, for example FD1 may be shared by the first shared pixel group SGG1 of first to third green pixels G1 to G3 which extend in the first direction X. In addition, as shown in at least FIGS. 4-5 and 7-8, where the first nona red pixel group NRG1 includes pixels in an array along the first and second directions X and Y (e.g., R1 to R9), a fourth floating diffusion FD4 may be shared by at least a portion of the pixels that are arranged in the first direction X, for example FD4 may be shared by the first shared pixel group SRG1 of first to third red pixels R1 to R3 which extend in the first direction X.

Here, the pixels (e.g., the first to third green pixels G1 to G3) that share the floating diffusion FD are arranged along the first direction X, the floating diffusion FD extends along the first direction X, and the column line COL may extend along the second direction Y. That is, the floating diffusion FD and the column line COL may be formed to intersect each other. This will be described in more detail referring to FIG. 5.

Referring to FIG. 5, the upper chip 200 of the image sensor 100 may include a first shared green pixel group SGG1 and a first shared red pixel group SRG1. Although only the upper chip 200 is shown in the drawings, the example embodiments of the present inventive concepts are not limited thereto, and the image sensor 100 may also include the lower chip 300. The first shared green pixel group SGG1 may include first to third green pixels G1 to G3 arranged in the first direction X, and the first shared red pixel group SRG1 may include first to third red pixels R1 to R3 arranged in the first direction X.

The upper chip 200 may include a semiconductor substrate 220, a photoelectric conversion layer 221, a transistor (TR) pixel isolation pattern 225, and the like.

The semiconductor substrate 220 may be, for example, bulk silicon or SOI (silicon-on-insulator). The semiconductor substrate 220 may be a silicon substrate or may include other materials, for example, silicon germanium, indium antimonide, lead tellurium compounds, indium arsenic, indium phosphide, gallium arsenide or gallium antimonide. Alternatively, the semiconductor substrate 220 may have an epitaxial layer formed on a base substrate. The semiconductor substrate 220 may include a front surface and a rear surface that are opposite to each other. In some example embodiments, the rear surface of the semiconductor substrate may be a light-receiving surface on which light is incident.

In some example embodiments, a transistor TR may be placed on the front surface of the semiconductor substrate 220. The transistor TR may include, for example, at least a part of various transistors (e.g., a transfer transistor, a reset transistor, a source follower transistor, a selection transistor, and the like) that make up the unit pixel of the image sensor.

The transistor TR may include a gate insulating film 222, a gate electrode 223, and an impurity injection region 224. The gate insulating film 222 may be formed along a trench formed inside the semiconductor substrate 220. The gate electrode 223 may fill a region defined by the gate insulating film 222. The impurity injection region 224 may be formed by doping the semiconductor substrate 220 with impurities. Here, the gate electrode 223 may act as a gate of the transistor TR, and the impurity injection region 224 may act as a source/drain of the transistor TR.

The pixel isolation pattern 225 may be placed inside the semiconductor substrate 220. The pixel isolation pattern 225 may define a plurality of unit pixels. The unit pixels may be arranged two-dimensionally from a planar viewpoint. For example, the pixel isolation pattern 225 may be formed in a grid pattern from the planar viewpoint to separate the unit pixels from each other. The pixel isolation pattern 225 may be formed by burying an insulating material in a deep trench formed by patterning the semiconductor substrate 220. As shown in at least FIG. 5, the first nona green pixel group NGG1 (e.g., first pixel group) and the first nona red pixel group NRG1 (e.g., third pixel group) may be separated from each other by a pixel isolation pattern 225 as a boundary. It will be further understood that, referring to at least FIG. 4, the first nona green pixel group NGG1 (e.g., first pixel group) and the first nona blue pixel group NBG1 (e.g., second pixel group) may be separated from each other by a pixel isolation pattern 225 as a boundary.

In some example embodiments, the pixel isolation pattern 225 may include an insulating spacer film 226 and a conductive filling pattern 227. The insulating spacer film 226 may conformally extend along the side surfaces of the trench in the semiconductor substrate 220. The conductive filling pattern 227 may be formed on the insulating spacer film 226 to fill a part of the trench in the semiconductor substrate 220.

Figure 6B:
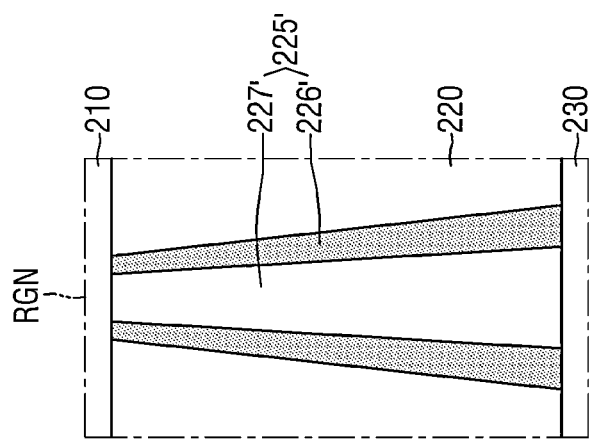

FIGS. 6A and 6B are enlarged views of a region RGN of FIG. 5 according to some example embodiments.

Referring to FIG. 6A, the pixel isolation pattern 225 may be formed from the rear surface of the semiconductor substrate 220. That is, the trench is formed on the rear surface of the semiconductor substrate 220, the insulating spacer film 226 is formed in the formed trench, and the conductive filling pattern 227 is filled on the insulating spacer film 226, thereby forming the pixel isolation pattern 225. The pixel isolation pattern 225 may not be in contact with the front surface of the semiconductor substrate 220. Here, the pixel isolation pattern 225 may be a BDTI (backside deep trench isolation).

Referring to FIG. 6B, a pixel isolation pattern 225' may be formed from the front surface of the semiconductor substrate 220. A trench may be formed on the front surface of the semiconductor substrate 220. Here, the trench formed from the front surface may penetrate the semiconductor substrate 220. After that, an insulating spacer film 226' is formed in the trench, and a conductive filling pattern 227' is filled on the insulating spacer film 226', thereby forming the pixel isolation pattern 225'. Here, the pixel isolation pattern 225' may be a FDTI (frontside deep trench isolation).

Referring to FIG. 5 again, the unit pixel may include a photoelectric conversion layer 221. The photoelectric conversion layer 221 may be formed inside the semiconductor substrate 220. The photoelectric conversion layer 221 may generate electric charges in proportion to an amount of light that is incident from the outside. The photoelectric conversion layer 221 may be formed by doping impurities inside the semiconductor substrate 220. For example, when the semiconductor substrate 220 is doped with a p-type impurity, the photoelectric conversion layer 221 may be doped with an n-type impurity. A photodiode may be formed by the photoelectric conversion layer 221 and the semiconductor substrate 220.

The upper chip 200 may include a surface insulating layer 210, a passivation layer 240, a grid pattern 250, a first liner 253, color filters CF_G and CF_R, a microlens ML, a second liner 254, and the like.

The surface insulating layer 210 may be stacked on the rear surface of the semiconductor substrate 220. The passivation layer 240 may be stacked on the surface insulating layer 210. The grid pattern 250, the first liner 253, the color filters CF_G and CF_R, the microlens ML and the second liner 254 may be placed in the region defined by the surface insulation layer 210.

The color filters CF_G and CF_R may be formed on the surface insulating layer 210. The color filters CF_G and CF_R may be arranged to correspond to each unit pixel. Each of the color filters CF_G and CF_R may be arranged two-dimensionally from the planar viewpoint. The green color filter CF_G may be arranged to be adjacent to the red color filter CF_R. The microlens ML may be formed on the color filters CF_G and CF_R. The microlenses ML may be arranged to correspond to each unit pixel and may each cover (e.g., at least partially overlap in the Z-direction) a separate photodiode (e.g., separate one of photodiodes PDG1 to PDG3) of a separate pixel (e.g., G1 to G3). The microlens ML may have a convex shape and have a predetermined radius of curvature. Accordingly, the microlens ML may collect the light that is incident on the photoelectric conversion layer 221. The microlens ML may include, but is not limited to, for example, a light-transmitting resin.

The grid pattern 250 may be formed between the color filters CF_G and CF_R. The grid pattern 250 may be formed on the surface insulating layer 210. The grid pattern 250 may include, for example, a metal pattern 251 and a low refractive index pattern 252. The metal pattern 251 and the low refractive index pattern 252 may be sequentially stacked on the surface insulating layer 210.

The first liner 253 may be formed on the surface insulating layer 210 and the grid pattern 250. The first liner 253 may extend along the surface of the surface insulating layer 210 and the grid pattern 250. The first liner 253 may include, but is not limited to, for example, aluminum oxide.

The second liner 254 may extend along the surface of the microlens ML. The second liner 254 may include, but is not limited to, for example, an inorganic oxide film (e.g., silicon oxide, titanium oxide, zirconium oxide, hafnium oxide, and combinations thereof).

The upper chip 200 may include a plurality of metal layers ML1, ML2, ML3, ML3', ML4_1, and ML5_1 to ML5_6, a plurality of contacts C1 to C5, and a bonding pad BP. The upper chip 200 may also include an inter-wiring insulating layer 230. The inter-wiring insulating layer 230 may be formed on one surface of the semiconductor substrate 220. That is, the transistor TR may be placed at a boundary between the semiconductor substrate 220 and the inter-wiring insulating layer 230. The plurality of metal layers ML1, ML2, ML3, ML3', ML4_1, and ML5_1 to ML5_6, the plurality of contacts C1 to C5, and the bonding pad BP may be formed in the inter-wiring insulating layer 230.

The plurality of metal layers ML1, ML2, ML3, ML3', ML4_1, and ML5_1 to ML5_6, the plurality of contacts C1 to C5, and the bonding pad BP may include a conductive material. For example, the plurality of metal layers ML1, ML2, ML3, ML3', ML4_1, and ML5_1 to ML5_6, the plurality of contacts C1 to C5, and the bonding pad BP may include metal materials such as copper and lead.

The first contact C1 may be connected to the transistor TR. The first contact C1 may be directly connected to the gate and the source drain of the transistor TR. The first metal layer ML1 may be placed on the first contact C1, and may be directly connected to the first contact C1. Here, although the first metal layer ML1 is shown as being connected to all the first contacts C1, the example embodiments of the present inventive concepts are not limited thereto. The second contact C2 may be placed on the first metal layer ML1 and may be directly connected to the first metal layer ML1. The second metal layer ML2 may be placed on the second contact C2 and may be directly connected to the second contact C2. The first metal layer ML1 or the second metal layer ML2 connected to the gate of the transistor TR may be connected to the row driver 1130. The first metal layer ML1 or the second metal layer ML2 connected to the source drain at one end of the transistor TR may be connected to a ground electrode. Further, the first metal layer ML1 or the second metal layer ML2 connected to the source drain at the other end different from one end of the transistor TR may be connected to the third contact C3. Here, the second metal layer ML2 may be omitted, and only the first metal layer ML1 may be included in the inter-wiring insulating layer 230.

The third metal layer ML3 may be connected to the third contact C3 of the first green pixel G1, the third contact C3 of the second green pixel G2, and the third contact C3 of the third green pixel G3. That is, the first to third green pixels G1 to G3 may be shared by the third metal layer ML3. The three transistors TR may be connected in common to the third metal layer ML3, and the pixel signal sent from each photoelectric conversion layer 221 may be sent to the third metal layer ML3. The third metal layer ML3 may be formed by extending in the first direction X. The length of the third metal layer ML3 in the first direction X may be greater than the width in the second direction Y. The third metal layer ML3 may be overlapped by the first to third green pixels G1 to G3. The third metal layer ML3 may correspond to the floating diffusion FD shown in FIG. 3. That is, the third metal layer ML3 may be a floating diffusion FD formed between the transfer transistor and the source follower transistor. Accordingly, the floating diffusion FD may extend in the first direction X.

However, the example embodiments of the present inventive concepts are not limited thereto. For example, the floating diffusion FD is not limited to the third metal layer ML3. For example, only the first metal layer ML1 may form the floating diffusion FD, and both the first metal layer ML1 and the second metal layer ML2 may form the floating diffusion FD. Further, the first metal layer ML1, the second metal layer ML2 and the third metal layer ML3 may all form the floating diffusion FD. Further, the first metal layer ML1, the second metal layer ML2, and the third metal layer ML3 may each extend in the first direction X.

Also, each pixel of each pixel array PA may include each floating diffusion FD. For example, the first green pixel G1, the second green pixel G2, and the third green pixel G3 may each include the floating diffusion FD. Restated, and referring to at least FIGS. 5 and 7, where the first to third green pixels G1 to G3 each include a respective photodiode PDG1 to PDG3 as at least partially defined by photoelectric conversion layers 221 in the semiconductor substrate 220, the pixel array PA may include a first floating diffusion FD (e.g., at least partially defined by the first metal layer ML1 and/or second metal layer ML2 in the first green pixel G1) that is configured to accumulate electric charges generated by the first photodiode PDG1, a separate second floating diffusion FD (e.g., at least partially defined by the first metal layer ML1 and/or second metal layer ML2 in the second green pixel G2) that is configured to accumulate electric charges generated by the second photodiode PDG2, and a third floating diffusion FD (e.g., at least partially defined by the first metal layer ML1 and/or second metal layer ML2 in the third green pixel G3) that is configured to accumulate electric charges generated by the third photodiode PDG3. The first to third floating diffusions of the separate first to third green pixels G1 to G3 may be connected to a source follower transistor SF1 as described herein (e.g., as shown in FIG. 8 for a case where a floating diffusion FD is shared between pixels), where the source follower transistor SF1 is configured to output a first pixel signal (e.g., SIG_PX as shown in FIG. 8) based on the electric charges accumulated in at least one of the first to third floating diffusions FD. Further restated, the first to third green pixels G1 to G3 may not share a floating diffusion. Here, the floating diffusions FD included in the first to third green pixels G1 to G3 may be arranged in the first direction (e.g., may overlap in the first direction X). However, the example embodiments of the present inventive concepts are not limited thereto. In some example embodiments, the floating diffusions FD included in the first to third green pixels G1 to G3 (e.g., first to third floating diffusions FD) may collectively form (e.g., define) a metal layer extending in the first direction X, for example at least one of the first metal layer ML1, the second metal layer ML2, or the third metal layer ML3.

A third metal layer ML3' may be connected to the third contact C3 of the first red pixel R1, the third contact C3 of the second red pixel R2, and the third contact C3 of the third red pixel R3. That is, the first to third red pixels R1 to R3 may be shared by the third metal layer ML3'. The three transistors TR may be connected in common with the third metal layer ML3', and the pixel signal sent from each photoelectric conversion layer 221 may be sent to the third metal layer ML3'. The third metal layer ML3' may be formed by extending in the first direction X, similarly to the third metal layer ML3. That is, the third metal layer ML3' may be formed alongside the third metal layer ML3. The length of the third metal layer ML3' in the first direction X may be greater than the width in the second direction Y. The third metal layer ML3' may be overlapped by the first to third red pixels R1 to R3. The third metal layer ML3' may correspond to the floating diffusion FD shown in FIG. 4. That is, the third metal layer ML3' may be a floating diffusion FD formed between the transfer transistor and the source follower transistor.

However, the example embodiments of the present inventive concepts are not limited thereto. For example, the floating diffusion FD is not limited to the third metal layer ML3'. For example, only the first metal layer ML1 may form the floating diffusion FD, and both the first metal layer ML1 and the second metal layer ML2 may form the floating diffusion FD. Further, the first metal layer ML1, the second metal layer ML2 and the third metal layer ML3' may all form the floating diffusion FD. Further, the first metal layer ML1, the second metal layer ML2, and the third metal layer ML3' may each extend in the first direction X.

The third metal layer ML3 may be spaced apart from the third metal layer ML3' in the first direction X.

A fourth metal layer ML4_1 and a fourth metal layer ML4_4 may be formed on the third metal layer ML3 and the third metal layer ML3'. That is, the fourth metal layer ML4_1 may be formed on the third metal layer ML3 of the first shared green pixel group SGG1, and the fourth metal layer ML4_4 may be formed on the third metal layer ML3' of the first shared red pixel group SRG1. Although not shown here, the fourth metal layer ML4_1 may be electrically connected to the third metal layer ML3 to receive a pixel signal, and the fourth metal layer ML4_4 may be electrically connected to the third metal layer ML3' to receive the pixel signal. Here, the fourth metal layer ML4_1 and the fourth metal layer ML4_4 may correspond to the column line COL of FIG. 3. That is, the fourth metal layer ML4_1 and the fourth metal layer ML4_4 may extend in the second direction Y. Therefore, the fourth metal layer ML4_1 and the fourth metal layer ML4_4 may intersect the third metal layer ML3 and the third metal layer ML3'. However, the column line COL is not limited to the fourth metal layer ML4_1 and the fourth metal layer ML4_4. For example, fifth metal layers ML5_1 to ML5_6 may also correspond to the column line COL. That is, the fifth metal layers ML5_1 to ML5_6 may also extend in the second direction Y and may intersect the third metal layer ML3 and the third metal layer ML3'.

The third metal layer ML3 and the fourth metal layer ML4_4 may be spaced apart from each other in the first direction X. The third metal layer ML3 and the fourth metal layer ML4_4 may be spaced apart from each other by a first distance D1. Although the first distance D1 may be smaller than the size of one pixel of the pixel array PA, the example embodiments of the present inventive concepts are not limited thereto.

When the image sensor 100 operates, an electrical signal may be sent to the third metal layer ML3 and the fourth metal layer ML4_4. In this case, a coupling effect due to the third metal layer ML3 and the fourth metal layer ML4_4 may occur. That is, a coupling capacitance may occur between the third metal layer ML3 and the fourth metal layer ML4_4. At this time, when the third metal layer ML3 and the fourth metal layer ML4_4 are formed to intersect each other, an area in which the third metal layer ML3 and the fourth metal layer ML4_4 face each other may correspond to an area of the side surface of the third metal layer ML3. Therefore, the coupling capacitance due to the third metal layer ML3 and the fourth metal layer ML4_4 formed to intersect each other may be smaller than the coupling capacitance due to the third metal layer ML3 and the fourth metal layer ML4_4 when formed to be parallel to each other. Accordingly, the image quality of the image sensor 100 including the third metal layer ML3 and the fourth metal layer ML4_4 may be improved. In particular, in the pixel having different color filters CF_G and CF_R, an image quality improvement effect of the image sensor 100 due to a decrease in coupling capacitance of the third metal layer ML3 and the fourth metal layer ML4_4 may increase.

Subsequently, the fourth metal layer ML4_1 and the fourth metal layer ML4_4 may be connected to a fourth contact C4, fifth metal layers ML5_1 to ML5_6, a fifth contact C5, and a bonding pad BP. The fourth contact C4, the fifth metal layers ML5_1 and ML5_4, the fifth contact C5, and the bonding pad BP may receive the pixel signals from the fourth metal layer ML4_1 and the fourth metal layer ML4_4. The bonding pad BP may be connected to the circuit of the lower chip 300, and the pixel signal may be sent to the lower chip 300 through the bonding pad BP.

Hereinafter, the shape and operation of the image sensor 100 will be described referring to FIGS. 1 to 9.

Figure 7:
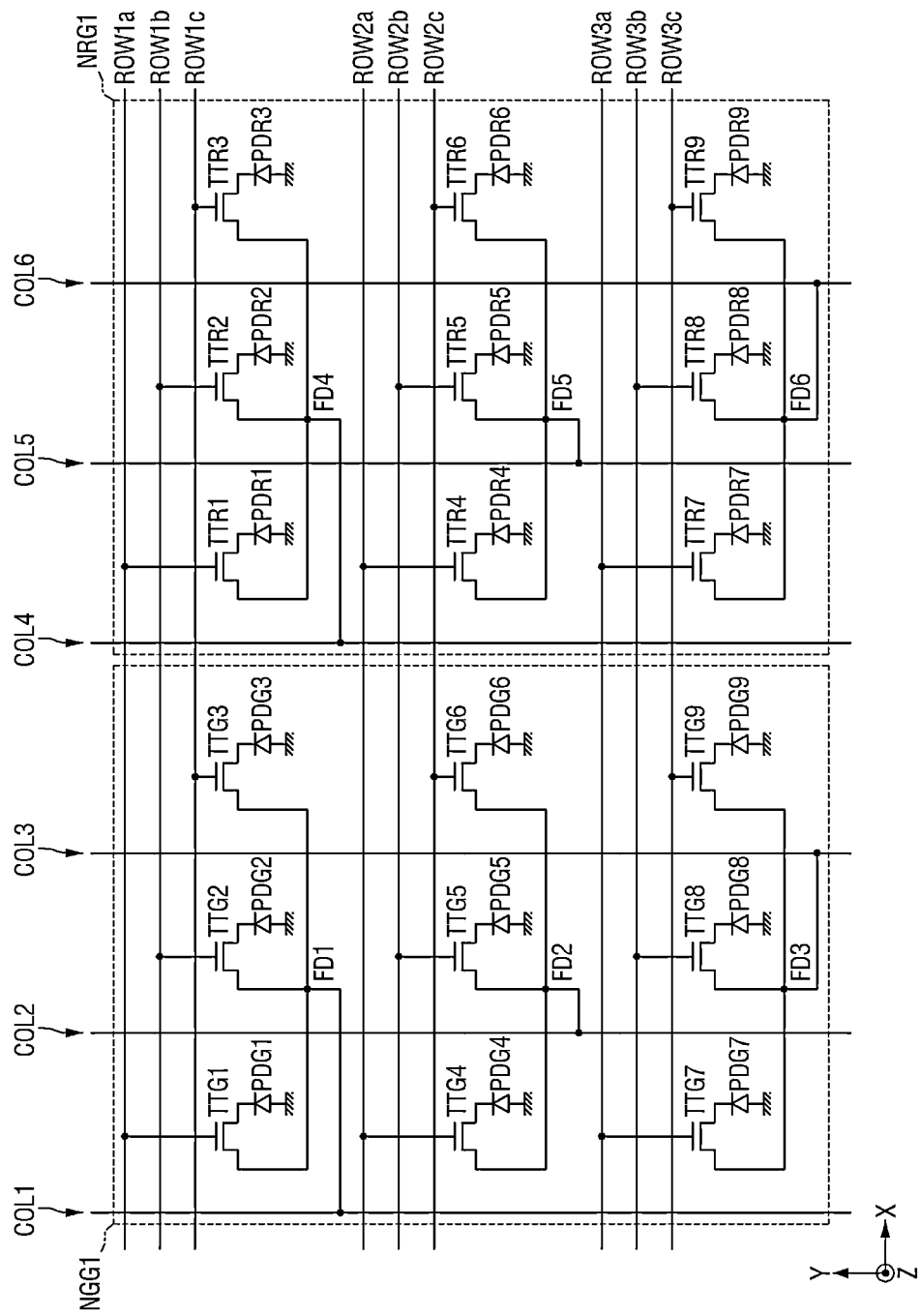
FIG. 7 is a circuit diagram of a pixel array according to some example embodiments.
Figure 8:
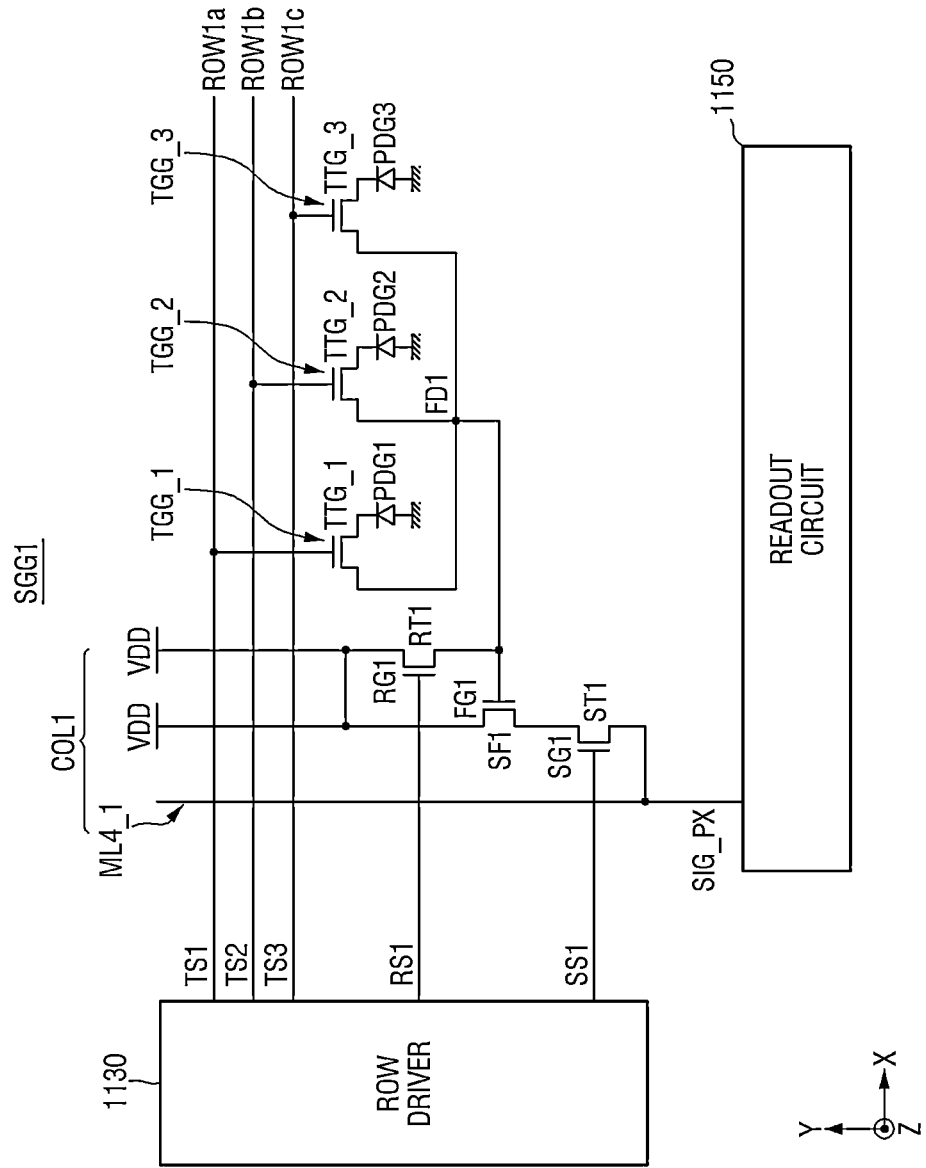
FIG. 8 is a circuit diagram of a pixel array according to some example embodiments.

FIG. 7 is a circuit diagram of a pixel array according to some example embodiments.

Figure 9:
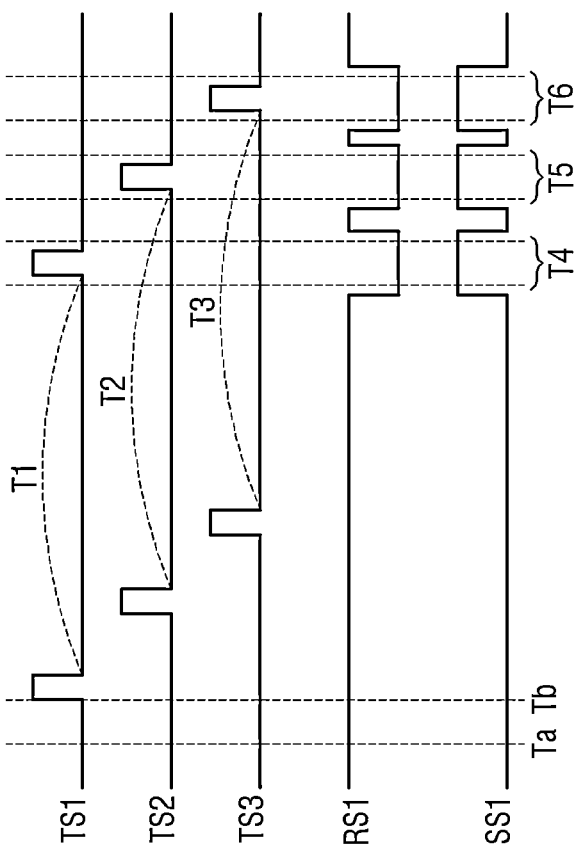
FIG. 9 is a timing diagram for explaining the operation of the image sensor according to some example embodiments.

FIG. 8 is a circuit diagram of a pixel array according to some example embodiments. FIG. 9 is a timing diagram for explaining the operation of the image sensor according to some example embodiments.

Referring to FIG. 7, the pixel array PA may include a plurality of column lines COL1 to COL6, a plurality of row lines ROW1a to ROW1c, ROW2a to ROW2c, and ROW3a to ROW3c, a first nona green pixel group NGG1, and a first nona red pixel group NRG1. That is, FIG. 7 shows only two nona pixel groups.

The plurality of column lines COL1 to COL6 and the plurality of row lines ROW1a to ROW1c, ROW2a to ROW2c, and ROW3a to ROW3c are formed over the first nona green pixel group NGG1 and the first nona red pixel group NRG1. The plurality of column lines COL1 to COL6 may extend in the second direction Y, and the plurality of row lines ROW1a to ROW1c, ROW2a to ROW2c, and ROW3a to ROW3c may extend in the first direction X.

The transfer transistor of each pixel may be formed between the plurality of row lines ROW1a to ROW1c, ROW2a to ROW2c, and ROW3a to ROW3c and the plurality of column lines COL1 to COL6. That is, the transfer transistor of each pixel may connect the plurality of row lines ROW1a to ROW1c, ROW2a to ROW2c, and ROW3a to ROW3c and the plurality of column lines COL1 to COL6.

For example, the gate of each of the green pixel transfer transistors TTG1 to TTG9 may be connected to each of the row lines ROW1a to ROW1c, ROW2a to ROW2c, and ROW3a to ROW3c. The source drain of each of the green pixel transfer transistors TTG1 to TTG9 may be connected to each of the green pixel photodiodes PDG1 to PDG9.

The source drain of the green pixel transfer transistors TTG1 to TTG3 may be connected to the first floating diffusion FD1, and the first floating diffusion FD1 may be connected to the first column line COL1. The source drain of the green pixel transfer transistors TTG4 to TTG6 may be connected to the second floating diffusion FD2, and the second floating diffusion FD2 may be connected to the second column line COL2. The source drain of the green pixel transfer transistors TTG7 to TTG9 may be connected to the third floating diffusion FD3, and the third floating diffusion FD3 may be connected to the third column line COL3.

For example, the gate of each of the red pixel transfer transistors TTR1 to TTR9 may be connected to each of the row lines ROW1a to ROW1c, ROW2a to ROW2c, and ROW3a to ROW3c. The source drain of each of the red pixel transfer transistors TTR1 to TTR9 may be connected to each of the red pixel photodiodes PDR1 to PDR9.

The source drain of the red pixel transfer transistors TTR1 to TTR3 may be connected to the fourth floating diffusion FD4, and the fourth floating diffusion FD4 may be connected to the fourth column line COL4 (e.g., the fourth column line COL4 may be connected to the nona red pixel group NRG1, may extend in the second direction Y and may be configured to receive a pixel signal based on the amount of electric charges accumulated in the fourth floating diffusion FD4). The source drain of the red pixel transfer transistor TTR4 to TTR6 may be connected to the fifth floating diffusion FD5, and the fifth floating diffusion FD5 may be connected to the fifth column line COL5. The source drain of the red pixel transfer transistors TTR7 to TTR9 may be connected to the sixth floating diffusion FD6, and the sixth floating diffusion FD6 may be connected to the sixth column line COL6.

Referring to FIG. 8, the first shared green pixel group SGG1 may be connected to the first column line COL1. Here, the first column line COL1 may include a first reset transistor RT1, a first source follower transistor SF1, a first selection transistor ST1, and a fourth metal layer ML4_1. Here, the fourth metal layer ML4_1 may be the same as the fourth metal layer ML4_1 of FIG. 5. The first row lines ROW1a to ROW1c, the first reset gate RG1 of the first reset transistor RT1, and the first selection gate SG1 of the first selection transistor ST1 may be connected to the row driver 1130. The row driver 1130 may transmit the first to third transmission control signals TS1 to TS3 to the first row lines ROW1a to ROW1c, may transmit the reset control signal RS1 to the first reset gate RG1, and may transmit the selection control signal SS1 to the first selection gate SG1. The row driver 1130 may transmit the signal so that the first shared green pixel group SGG1 may output the pixel signal SIG_PX.

The first floating diffusion FD1 may be connected to the source drain of the first reset transistor RT1, and the other source drain of the reset transistor RT1 may be connected to a power supply voltage VDD. Further, the first floating diffusion FD1 may be connected to a source follower gate FG1 of the first source follower transistor SF1. A row line that extends in the first direction X to a gate of the first source follower transistor SF1. The source drain of the first source follower transistor SF1 may be connected to the power supply voltage VDD. The other source drain of the first source follower transistor SF1 may be connected to the source drain of the first selection transistor ST1, and the other source drain of the first selection transistor ST1 may be connected to the fourth metal layer ML4_1.

Referring to FIG. 9, the first to third green pixels G1 to G3 of the first shared green pixel group SGG1 may output the pixel signal SIG_PX at time points T4 to T6 different from each other, on the basis of the photocharges during each of the exposure times T1 to T3. At the time Ta, the row driver 1130 may transmit a logic-high reset control signal RS1 to the first reset transistor RT1 to reset the first floating diffusion FD1. In this case, the first reset transistor RT1 is turned on, and the power supply voltage VDD may be applied to the first floating diffusion FD1.

At the time Tb, the row driver 1130 may apply a logic-high first transmission control signal TS1 to the gate electrode TGG_1 of the first green pixel transfer transistor TTG1. Accordingly, the first green pixel photodiode PDG1 may discharge all the charged photocharges to the first floating diffusion FD1, and as a result, the first green pixel photodiode PDG1 may enter a reset status.

At the exposure time T1, the first green pixel photodiode PDG1 may charge the photocharges. That is, the first green pixel G1 may be exposed for the exposure time T1. Also, the second green pixel photodiode PDG2 may charge the photocharges during the exposure time T2, and the third green pixel photodiode PDG3 may charge the photocharges during the exposure time T3.

The photocharges output from the first to third green pixel photodiodes PDG1 to PDG3 may be sent to the first floating diffusion FD1 at the time points T4 to T6 different from each other. That is, the pixel signal SIG_PX output from each pixel may be output at time points different from each other. That is, by the reset control signal RS1 and the selection control signal SS1 at the time points T4 to T6 different from each other, the pixel signals SIG_PX at the time points different from each other may be sent to the readout circuit 1150 through the first column line COL1. The pixel signal SIG_PX sent to the readout circuit 1150 may be used for a binning operation. Here, the pixel signal SIG_PX is a pixel signal based on the electric charges accumulated in at least one of the first to third green pixel photodiodes PDG1 to PDG3. Further, the pixel signal SIG_PX may be output from the first source follower transistor SF1. The fourth metal layer ML4_1 may receive the first pixel signal SIG_PX from the first source follower transistor SF1 and send it to the readout circuit 1150. Accordingly, the column line COL to which at least the fourth metal layer ML4_1 corresponds (e.g., first column line COL1), which may extend in the second direction Y that intersects the first direction X may be configured to receive a first pixel signal SIG_PX based on an amount of electric charges accumulated in the floating diffusion (e.g., FD1, which may be shared by the first to third green pixels G1 to G3).

Referring to FIGS. 3-5 and 7-8, a floating diffusion may be shared by at least a portion of the pixels of, for example, the first nona blue pixel group NBG1 that are arranged in the first direction X (e.g., SBG1, having first to third blue pixels B1 to B3), for example a "second floating diffusion" that is similar to FD1 as shown in FIGS. 7-8 except corresponding to the pixel group NBG1 instead of NGG1, where the first column line COL1 is configured to receive a second pixel signal SIG_PX based on the amount of electric charges accumulated in the second floating diffusion.

Referring to FIGS. 3-5 and 7-8, a floating diffusion may be shared by at least a portion of the pixels of, for example, the first nona red pixel group NRG1 that are arranged in the first direction (e.g., SRG1, having first to third red pixels R1 to R3), for example floating diffusion FD4, also referred to herein as a "third floating diffusion," where the fourth column line COL4 may be configured to receive a "third" pixel signal SIG_PX based on the amount of electric charges accumulated in the third floating diffusion.

Referring to FIGS. 3-5 and 7-8 a floating diffusion may be shared by at least a portion of the pixels of, for example, the second nona green pixel group NGG2 that are arranged in the first direction (e.g., SGG4, having pixels G10 to G12), for example a "fourth floating diffusion" that is similar to FD4 as shown in FIGS. 7-8 except corresponding to the pixel group NGG2 instead of NRG1, where the fourth column line COL4 shown in at least FIG. 7 is configured to receive a "fourth" pixel signal SIG_PX based on the amount of electric charges accumulated in the fourth floating diffusion.

Referring to FIGS. 4-5 and 7-8, a pixel group (e.g., first nona green pixel group NGG1) may include a first color filter (e.g., green color filter CF_G), first to third green photodiodes (e.g., PDG 1 to PDG 3 of green pixels G1 to G3 as at least partially defined by photoelectric conversion layers 221 in the semiconductor substrate 220) that are below the first color filter (e.g., CF_G) such that the first color filter overlaps each of the first, second, and third photodiodes in a vertical direction (e.g., Z-direction), wherein the first, second, and third photodiodes (e.g., PDG1 to PDG3) overlap each other in a first direction X that is perpendicular to the vertical direction. At least some of the pixels may not share a floating diffusion, such that the pixel group (e.g., NGG1) may further include a first floating diffusion FD (e.g., at least partially defined by the first metal layer ML1 and/or second metal layer ML2 in the first green pixel G1 as shown in FIG. 5) configured to accumulate electric charges generated by the first photodiode (e.g., PDG1 of G1), a second floating diffusion FD (e.g., at least partially defined by the first metal layer ML1 and/or second metal layer ML2 in the second green pixel G2 as shown in FIG. 5) configured to accumulate electric charges generated by the second photodiode (e.g., PDG2 of G2), and a third floating diffusion FD (e.g., at least partially defined by the first metal layer ML1 and/or second metal layer ML2 in the third green pixel G3 as shown in FIG. 5) configured to accumulate electric charges generated by the third photodiode (e.g., PDG3 of G3). The pixel group (e.g., NGG1) may further include a source follower transistor SF1 configured to output a first pixel signal (e.g., SIG_PX) based on the electric charges accumulated in at least one of the first to third floating diffusions FD, and a first metal layer (e.g., metal layer ML4_1) configured to receive the first pixel signal (e.g., SIG_PX) from the source follower transistor SF1, wherein the first metal layer (e.g., ML4_1) extends in a second direction Y intersecting the first direction X, and where the first to third floating diffusions are arranged in the first direction X.

Additionally, in some example embodiments where floating diffusions are not shared between pixels, the pixel group (e.g., NGG1) may further include a fourth photodiode, a fifth photodiode and a sixth photodiode (e.g., PDG4 to PDG6 of green pixels G4 to G6) that are below the first color filter (e.g., CF_G) such that the first color filter overlaps each of the fourth, fifth, and sixth photodiodes in the vertical direction (e.g., Z direction), wherein the fourth, fifth, and sixth photodiodes overlap each other in the first direction (e.g., X-direction), and the pixel group includes a fourth floating diffusion FD (e.g., at least partially defined by the first metal layer ML1 and/or second metal layer ML2 in the fourth green pixel G4) configured to accumulate electric charges generated by the fourth photodiode (e.g., PDG4 of G4), a fifth floating diffusion FD (e.g., at least partially defined by the first metal layer ML1 and/or second metal layer ML2 in the fifth green pixel G5) configured to accumulate electric charges generated by the fifth photodiode (e.g., PDG5 of G5), and a sixth floating diffusion FD (e.g., at least partially defined by the first metal layer ML1 and/or second metal layer ML2 in the sixth green pixel G6) configured to accumulate electric charges generated by the sixth photodiode (e.g., PDG6 of G6). The pixel group (e.g., NGG1) may further include a second metal layer (e.g., corresponding to M4_1 as shown in at least FIGS. 5 and 8 except corresponding to COL2 instead of COL1 as shown in FIG. 7) that is configured to receive a second pixel signal (SIG_PX) based on the electric charges accumulated in at least one of the fourth to sixth floating diffusions FD, wherein the second metal layer extends in the second direction Y, and where the fourth to sixth floating diffusions FD are arranged in the first direction X.

Referring to FIGS. 4-5 and 7-8, the fourth to sixth photodiodes (e.g., PDG4 to PDG6 as at least partially defined by photoelectric conversion layers 221 in the semiconductor substrate 220 in pixels G4 to G6, respectively) may be spaced apart (e.g., isolated from direct contact, offset, etc.) from the first to third photodiodes (e.g., PDG1 to PDG3 as at least partially defined by photoelectric conversion layers 221 in the semiconductor substrate 220 in pixels G1 to G3, respectively) in the second direction Y.

The readout circuit 1150 may be connected to each of the respective metal layers (e.g., ML4_1) of the respective columns (e.g., COL1, COL2, etc.) that may receive a pixel signal based on electric charges accumulated in certain floating diffusions as described herein. For example, the readout circuit 1150 may be connected to the first metal layer (e.g., ML4_1 as described above) and the second metal layer (e.g., corresponding to M4_1 as shown in at least FIGS. 5 and 8 except corresponding to COL2 instead of COL1 as shown in FIG. 7).

Figure 10:
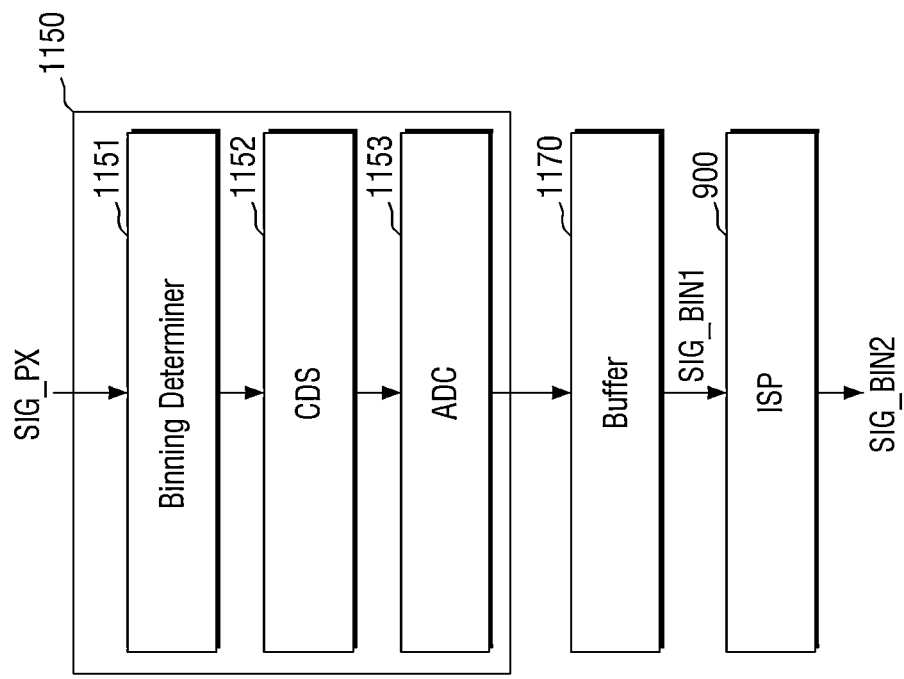
FIGS. 10 and 11 are diagrams for explaining the binning operation of the image sensor according to some example embodiments.
Figure 11:
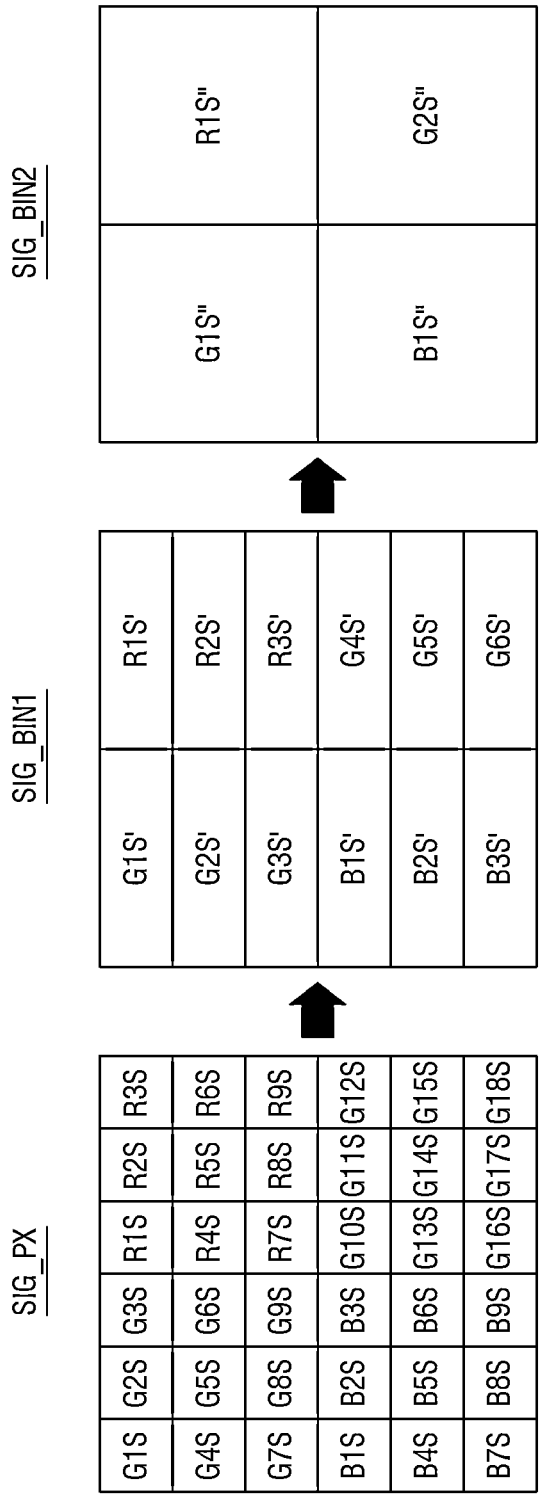

FIGS. 10 and 11 are diagrams for explaining the binning operation of the image sensor according to some embodiments.

Referring to FIG. 10, the readout circuit 1150 may include a binning determiner 1151, a correlated double sampler (CDS) 1152, and an analog-to-digital converter 1153. The binning determiner 1151 may receive the pixel signal SIG_PX that is output from the pixel array PA. That is, the binning determiner 1151 may receive a plurality of pixel signals SIG_PX from the first shared green pixel group SGG1. The binning determiner 1151 may determine whether to perform the binning operation on the pixel signal SIG_PX. When the binning determiner 1151 determines to perform the binning operation, the binning determiner 1151 may perform an analog binning operation on the pixel signal SIG_PX. Accordingly, the readout circuit 1150 may output the first binning image signal SIG_BIN1 by binning the pixel signal SIG_PX.

Referring to FIG. 11, the pixel signal SIG_PX may include first to eighteenth green pixel signals G1S to G18S, first to ninth red pixel signals R1S to R9S, and first to ninth blue pixel signals B1S to B9S. The first binning image signal SIG_BIN1 generated by the readout circuit 1150 may include first to sixth green pixel binning image signals G1S' to G6S', first to third red pixel binning image signals R1S' to R3S', and first to third blue pixel binning image signals B1S' to B3S'. For example, the first green pixel binning image signal G1S' may be a signal generated by performing the analog binning operation on the first to third green pixel signals G1S to G3S. For example, the readout circuit 1150 may receive a first pixel signal (e.g., at least one of G1S to G3S) from the first metal layer (e.g., M4_1) and perform an analog binning operation on the received first pixel signal to output a first image signal (e.g., G1S'), and the readout circuit 1150 may receive a second pixel signal (e.g., at least one of G4S to G6S) from the second metal layer (e.g., corresponding to M4_1 as shown in at least FIGS. 5 and 8 except corresponding to COL2 instead of COL1 as shown in FIG. 7) and perform an analog binning operation on the received second pixel signal to output a second image signal (e.g., G2S'). The readout circuit 1150 may be configured to simultaneously receive separate (e.g., first and second) pixel signals that are based on the amount of electric charges accumulated in respective floating diffusions of the nona green pixel group NGG1 (e.g., a floating diffusion FD1 that is shared between first to third green pixels G1 to G3) and of the nona blue pixel group NBG1 (e.g., a floating diffusion FD that is shared between first to third blue pixels B1 to B3).

Referring to FIG. 10 again, the buffer 1170 may receive the first binning image signal SIG_BIN1 from the readout circuit 1150 and send it to the image signal processor 900. The image signal processor 900 may perform a digital binning operation on the first binning image signal SIG_BIN1 (e.g., first image signal received from the readout circuit 1150) to generate (e.g., output) a second binning image signal SIG BIN2 (e.g., to output a second image signal).

Referring to FIG. 11, the second binning image signal SIG BIN2 may include first and second green pixel binning image signals G1S" and G2S", a first red pixel binning image signal R1S", and a first blue pixel binning image signal B1S". For example, the first green pixel binning image signal G1S" may be a signal generated by performing the digital binning operation on the first to third green pixel binning image signals G1S' to G3S'. Accordingly, it will be understood that the readout circuit 1150 may perform the digital bidding operation on image signals (e.g., at least one of G1S' to G3S') to output (e.g., transmit) a digital image signal (e.g., G1S"). A SNR (signal noise ratio) may be improved by performing the binning operation by the readout circuit 1150 and the image signal processor 900.

Hereinafter, an image sensor 100' according to some example embodiments will be described referring to FIGS. 12 and 13.

Figure 12:
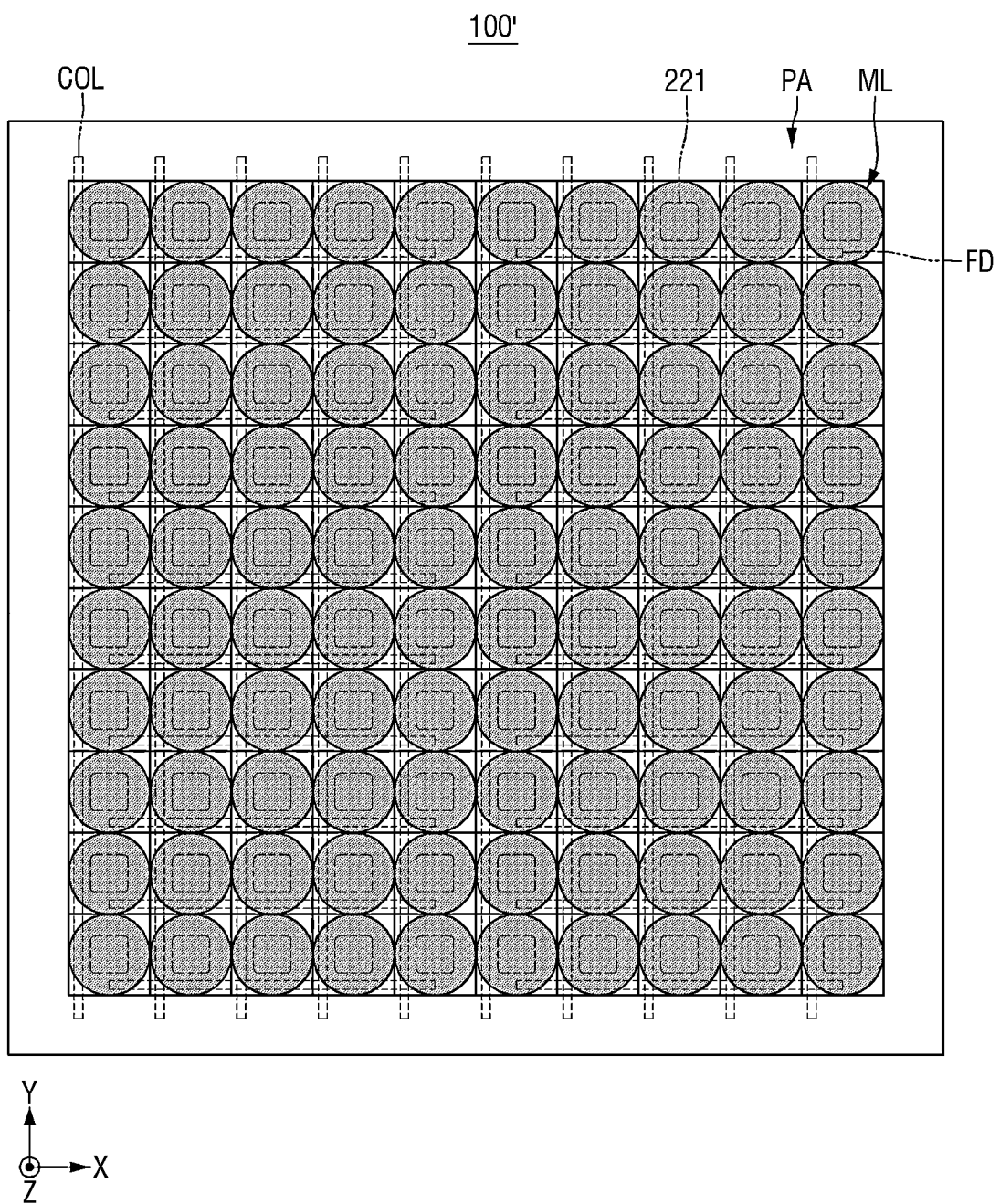
FIG. 12 is a top view of the image sensor according to some example embodiments.

FIG. 12 is a top view of the image sensor according to some example embodiments.

Figure 13:
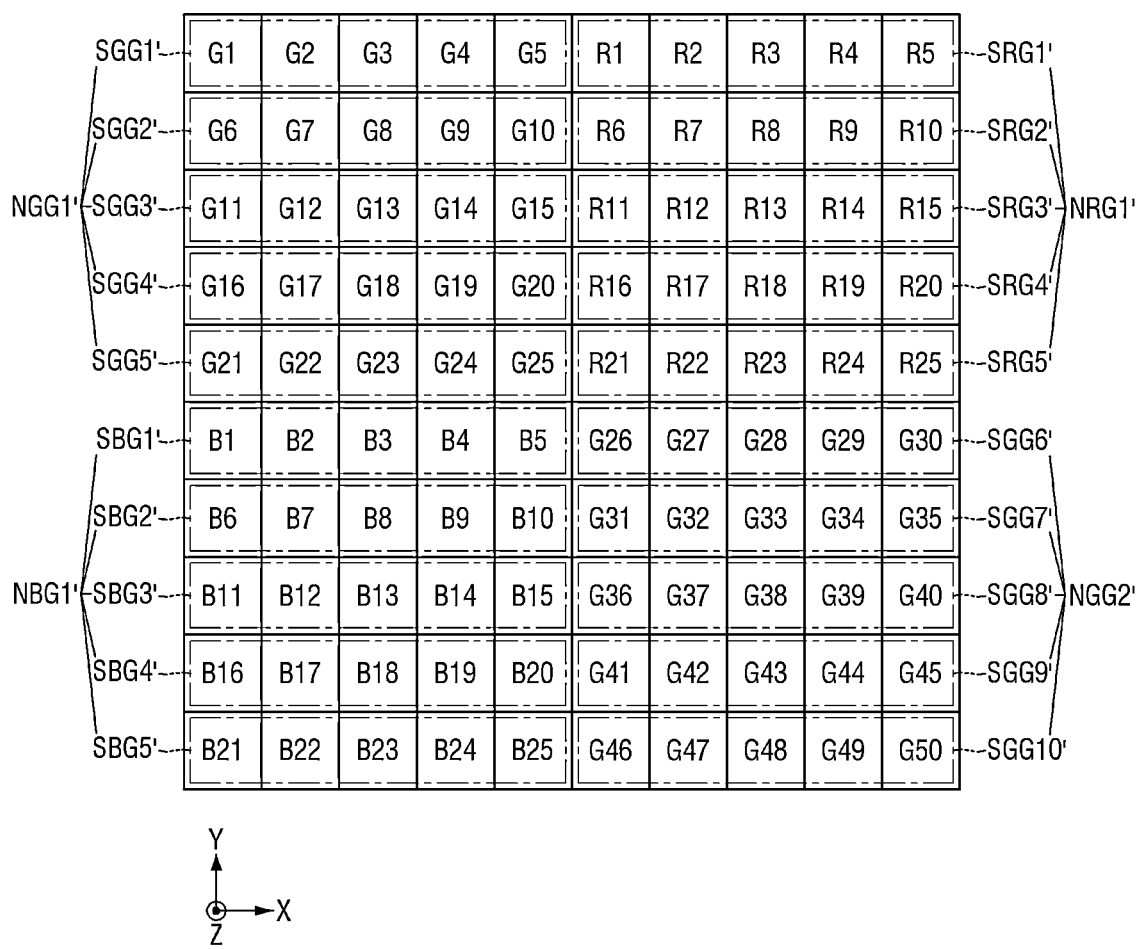
FIG. 13 is a diagram for explaining the pixel array of FIG. 12 according to some example embodiments.

FIG. 13 is a diagram for explaining the pixel array of FIG. 12 according to some example embodiments. For convenience of explanation, repeated parts of contents explained using FIGS. 1 to 11 will be briefly explained or omitted.

Referring to FIGS. 12 and 13, the image sensor 100' may include a pixel array PA' and a column line COL. The column line COL may extend in the second direction Y. The pixel array PA' may include a floating diffusion FD extending in the first direction X. Here, the floating diffusion FD may be shared by five pixels.

The pixel array PA' may be a pixel array of a 5×5 pattern. For example, a first nona green pixel group NGG1' may include twenty-five green pixels G1 to G25, a first nona red pixel group NRG1' may include twenty-five red pixels R1 to R25, a first nona blue pixel group NBG1' may include twenty-five blue pixels B1 to B25, and a second nona green pixel group NGG2' may include twenty-five green pixels G26 to G50. Accordingly, the first nona green pixel group NGG1' may include first to fifth photodiodes, of the first to fifth green, pixels G1 to G5, which are below the green filter CF_G in the vertical direction (e.g., Z-direction) and spaced apart from each other and overlapping each other in a first direction X. As described above with reference to FIGS. 4-5 and 7-8, the separate pixels of a pixel group may include separate floating diffusions. Referring to FIGS. 12-13, the first nona green pixel group NGG1' may include first to fifth floating diffusions FD (each at least partially defined by a separate photoelectric conversion layer 221 in the semiconductor substrate 220) of separate, respective first to fifth green pixels G1 to G5 which may be arranged in the first direction X and configured to accumulate electric charges generated by the first to fifth photodiodes, respectively. The source following transistor SF1 as described with reference to FIGS. 4-5 and 7-8 may be configured to output a pixel signal based on electric charges accumulated in at least one of the aforementioned first to fifth floating diffusions FD, and the first metal layer (e.g., ML4_1) may be configured to receive such a pixel signal (e.g., SIG_PX).

The first nona green pixel group NGG1' may include the first to fifth shared green pixel groups SGG1' to SGG5', and each of the first to fifth shared green pixel groups SGG1' to SGG5' may include five pixels and may share one floating diffusion FD. Pixels included in the first to fifth shared green pixel groups SGG1' to SGG5' may be arranged in the first direction X.

The first nona red pixel group NRG1' may include first to fifth shared red pixel groups SRG1' to SRG5', and each of the first to fifth shared red pixel groups SRG1' to SRG5' may include five pixels and may share one floating diffusion FD. Pixels included in the first to fifth shared red pixel groups SRG1' to SRG5' may be arranged in the first direction X.

The first nona blue pixel group NBG1' may include first to fifth shared blue pixel groups SBG1' to SBG5', and each of the first to fifth shared blue pixel groups SBG1' to SBG5' may include five pixels and may share one floating diffusion FD. Pixels included in the first to fifth shared blue pixel groups SBG1' to SBG5' may be arranged in the first direction X.

The second nona green pixel group NGG2' may include sixth to tenth shared green pixel groups SGG6' to SGG10', and each of the sixth to tenth shared green pixel groups SGG6' to SGG10' may include five pixels and may share one floating diffusion FD. Pixels included in the sixth to tenth shared green pixel groups SGG6' to SGG10' may be arranged in the first direction X.

Hereinafter, a pixel array PA" according to some example embodiments will be described referring to FIG. 14.

Figure 14:
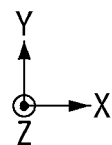
FIG. 14 is a diagram for explaining a pixel array according to some example embodiments.

FIG. 14 is a diagram for explaining a pixel array according to some example embodiments. For convenience of explanation, repeated parts of contents explained using FIGS. 1 to 11 will be briefly explained or omitted.

Referring to FIG. 14, the pixel array PA" may include first to fourth nona green pixel groups NGG1" to NGG4", first and second nona red pixel groups NRG1" and NRG2", first and second nona blue pixel groups NBG1" and NBG2", and first to eighth nona white pixel groups NWG1" to NWG8". That is, the pixel array PA" may be a pixel array in which the pixel group having a nona pattern is arranged in an RGBW pattern. That is, the pixel array PA" may correspond to the RGBW pattern. Here, the floating diffusion FD in each pixel group may extend in the first direction X, and the column line COL may extend in the second direction Y.

Hereinafter, an image sensor 100" according to some example embodiments will be described referring to FIG. 15.

Figure 15:
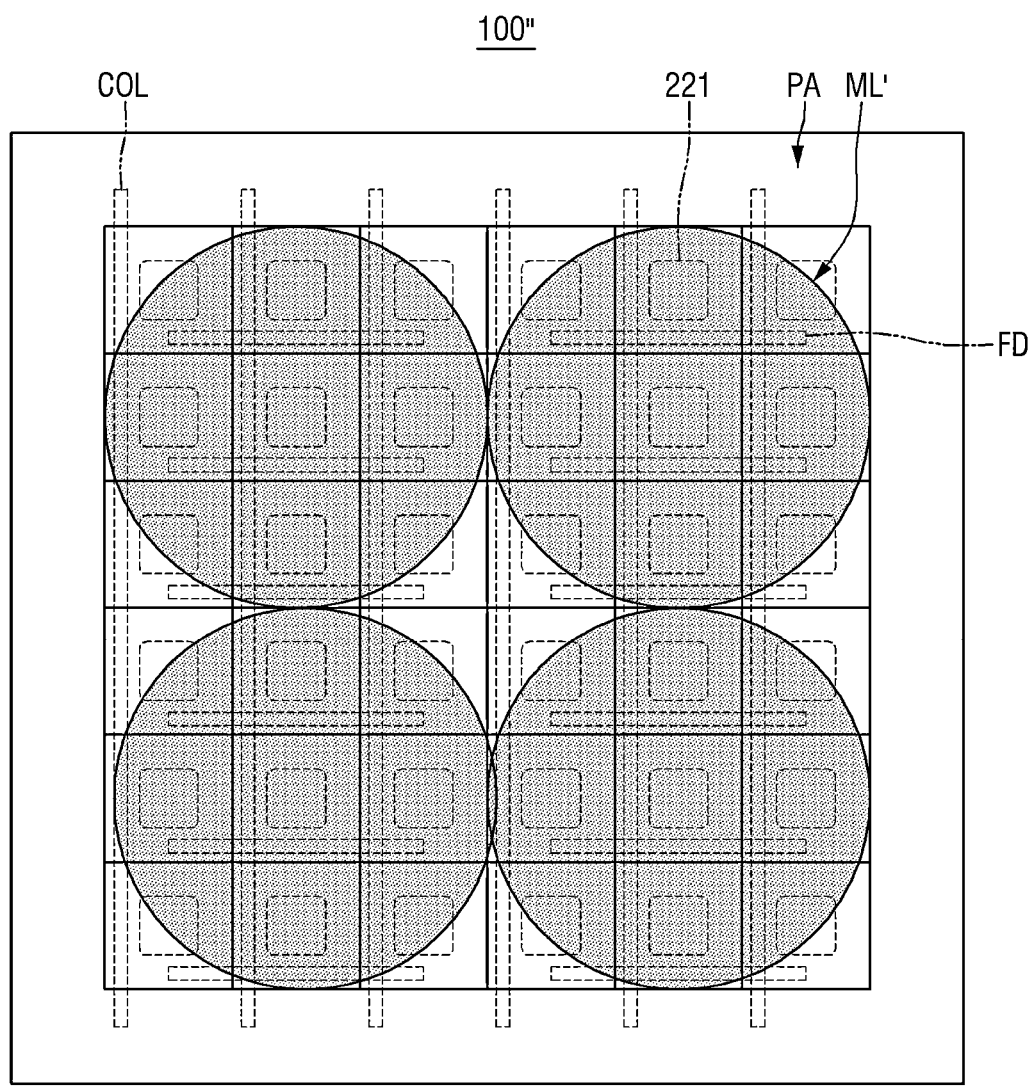
FIG. 15 is a top view of the image sensor according to some example embodiments.

FIG. 15 is a top view of the image sensor according to some example embodiments. For convenience of explanation, repeated parts of contents explained using FIGS. 1 to 11 will be briefly explained or omitted.

Referring to FIG. 15, the image sensor 100" may include a microlens ML'. Here, the microlens ML' may overlap a plurality of pixels. That is, unlike some example embodiments, including the example embodiments shown in FIGS. 1 to 11, in which the microlens ML of the image sensor 100 described referring to FIGS. 1 to 11 is on the green color filter CF_G and overlaps (e.g., covers) only one pixel such that the nona green pixel group NGG1 includes microlenses that each cover a separate pixel of the first to ninth green pixels G1 to G9 of the first nona green pixel group NGG1, the microlens ML' of the image sensor 100" that is on the green color filter CF_G may overlap (e.g., cover) all of the first to ninth green pixels G1 to G9 of the first nona green pixel group NGG1. Light transmitted through the microlens ML' may all enter the first nona green pixel group NGG1. However, the example embodiments of the present inventive concepts are not limited thereto.

Hereinafter, an image sensor 100 according to some example embodiments will be described referring to FIG. 16.

Figure 16:
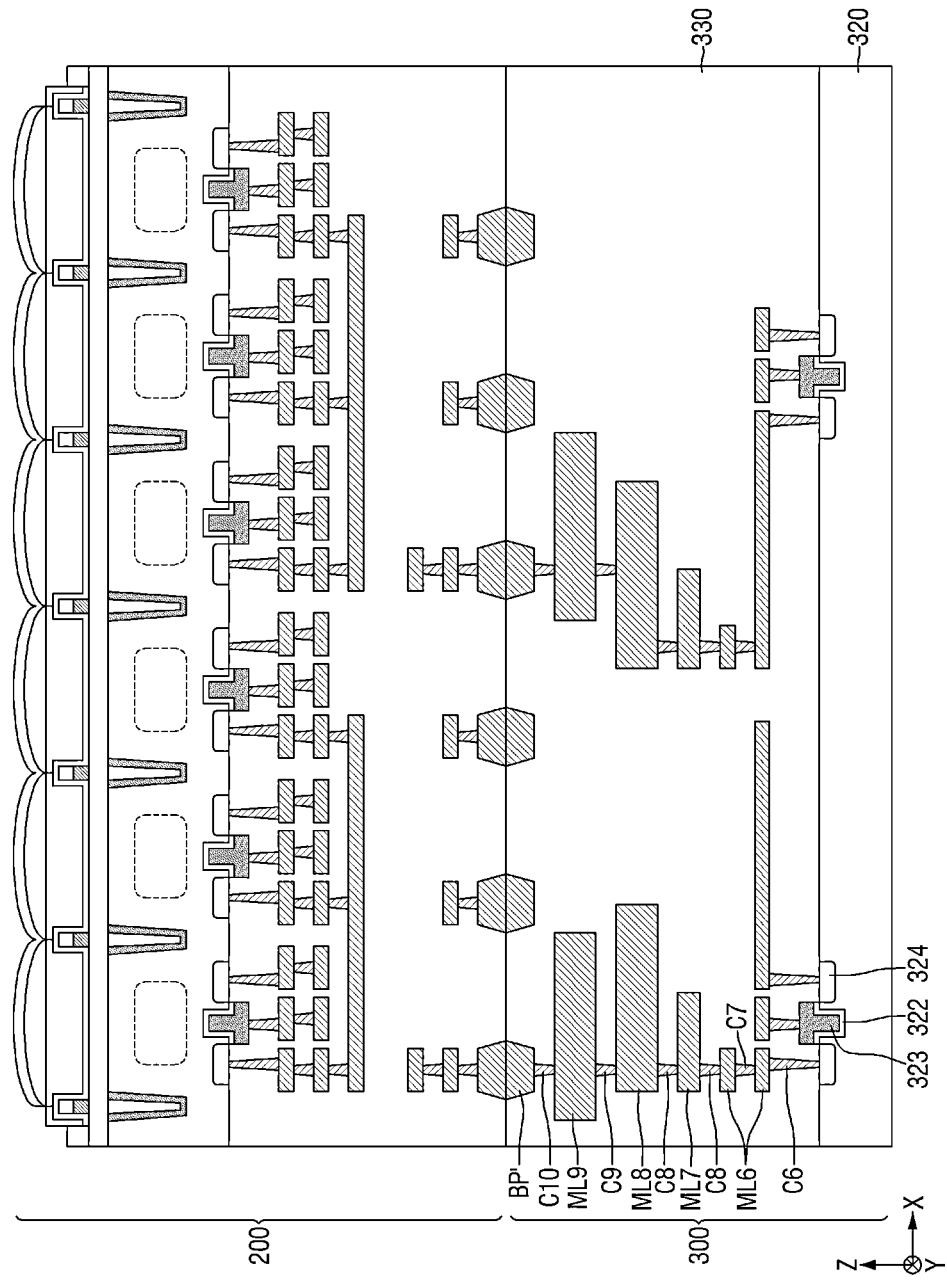
FIG. 16 is a cross-sectional view of an image sensor according to some example embodiments.

FIG. 16 is a cross-sectional view of an image sensor according to some example embodiments. For convenience of explanation, repeated parts of contents explained using FIGS. 1 to 11 will be briefly explained or omitted.

Referring to FIG. 16, the image sensor 100 may include a lower chip 300.

The lower chip 300 may be placed below the upper chip 200. That is, the lower chip 300 and the upper chip 200 may be in contact with each other on a bonding surface. The upper chip 200 and the lower chip 300 may be connected by the bonding pad BP and the bonding pad BP'.

The lower chip 300 may include a semiconductor substrate 320, a second transistor, an inter-wiring insulating layer 330, a connection structure, and the like. The connection structure may be formed inside the inter-wiring insulating layer 330. Here, the connection structure may include a plurality of metal layers ML6 to ML9, a plurality of contacts C6 to C10, and the like.

The semiconductor substrate 320 may be, for example, bulk silicon or SOI (silicon-on-insulator). The semiconductor substrate 220 may be a silicon substrate or may include other materials, for example, silicon germanium, indium antimonide, lead tellurium compounds, indium arsenic, indium phosphide, gallium arsenide or gallium antimonide.

The second transistor may be placed on the front surface of the semiconductor substrate 320. The second transistor may be implemented, for example, by logic elements such as the control register block 1110, the timing generator 1120, the row driver 1130, the readout circuit 1150, and the ramp signal generator 1160 of the image sensor 100. The second transistor may include a gate insulating film 322, a gate electrode 323, and an impurity injection region 324. The second transistor and the bonding pad BP' may be connected by the connection structure of the lower chip 300. Accordingly, the image sensor 100 may correspond to a 2-stack image sensor.

Hereinafter, an image sensor 100''' according to some example embodiments will be described referring to FIG. 17.

Figure 17:
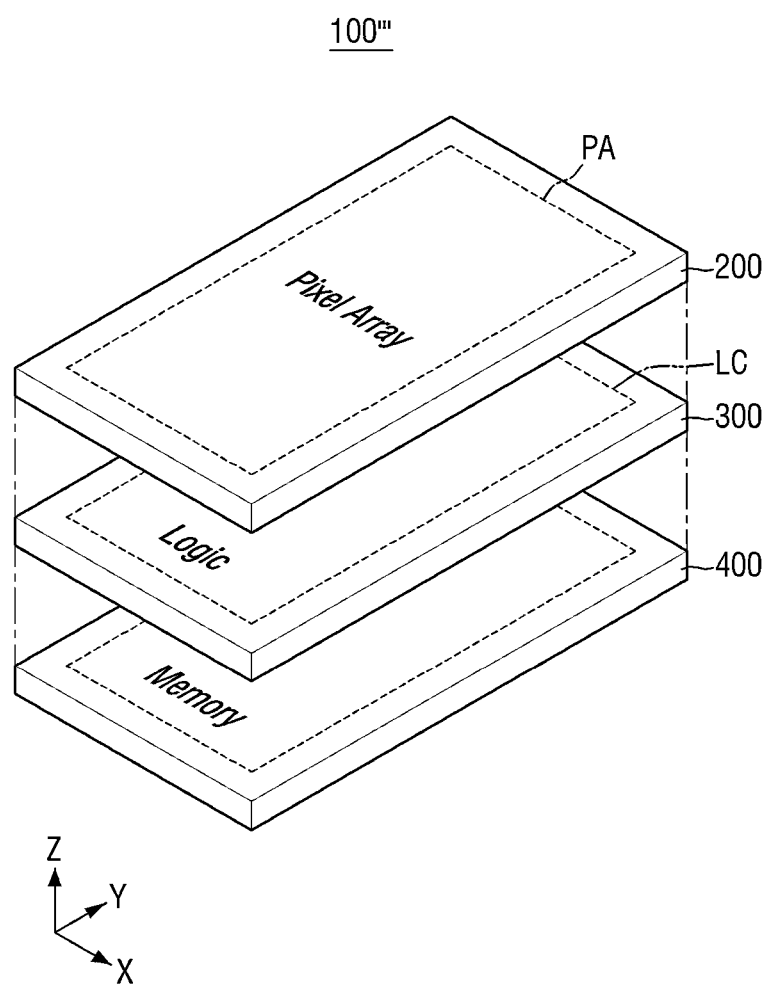
FIG. 17 is a diagram showing a conceptual layout of the image sensor according to some example embodiments.

FIG. 17 is a diagram showing a conceptual layout of the image sensor according to some example embodiments. For convenience of explanation, repeated parts of contents explained using FIGS. 1 to 16 will be briefly explained or omitted.

Referring to FIG. 17, the image sensor 100''' may include an upper chip 200, a lower chip 300 and a memory chip 400. Here, the upper chip 200, the lower chip 300, and the memory chip 400 may be sequentially stacked along the third direction Z, also referred to herein as a vertical direction. The memory chip 400 may be placed below the lower chip 300. The memory chip 400 may include a memory device. For example, the memory chip 400 may include a volatile memory device such as a DRAM and a SRAM. The memory chip 400 may receive signals from the upper chip 200 and the lower chip 300, and process the signals through the memory device. That is, the image sensor 100''' including the memory chip 400 may correspond to a 3-stack image sensor.

Hereinafter, an electronic device 2000 according to some example embodiments will be described referring to FIGS. 18 and 19.

Figure 18:
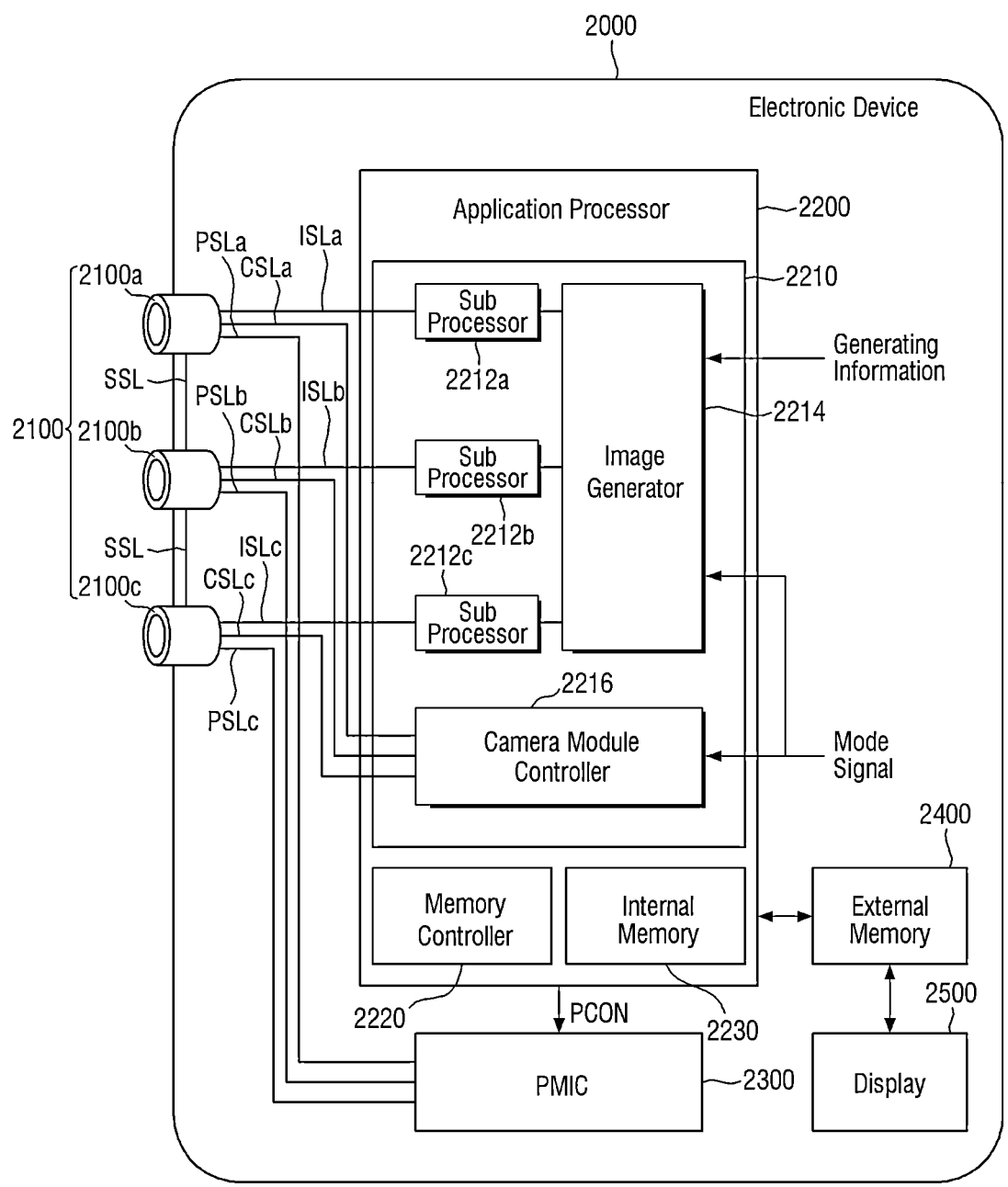
FIG. 18 is a block diagram for explaining an electronic device including a multi-camera module according to some example embodiments.

FIG. 18 is a block diagram for explaining an electronic device including a multi-camera module according to some example embodiments. FIG. 19 is a detailed block diagram of the camera module of FIG. 18 according to some example embodiments. For convenience of explanation, repeated parts of contents explained using FIGS. 1 to 17 will be briefly explained or omitted.

Referring to FIG. 18, the electronic device 2000 may include a camera module group 2100, an application processor 2200, a PMIC 2300, an external memory 2400, and a display 2500.

The camera module group 2100 may include a plurality of camera modules 2100a, 2100b, and 2100c. Even if the drawing shows some example embodiments in which the three camera modules 2100a, 2100b, and 2100c are placed, the example embodiments are not limited thereto. In some example embodiments, the camera module group 2100 may be modified to include only two camera modules. Also, in some example embodiments, the camera module group 2100 may be modified to include n (n is a natural number equal to or greater than 4) camera modules.

Here, one of the three camera modules 2100a, 2100b, and 2100c may be a camera module including the image sensor 100 described using FIGS. 1 to 32.

Hereinafter, although a detailed configuration of the camera module 2100b will be described in more detail referring to FIG. 19, the following description may also be equally applied to other camera modules 2100a and 2100c depending on some example embodiments.

Figure 19:
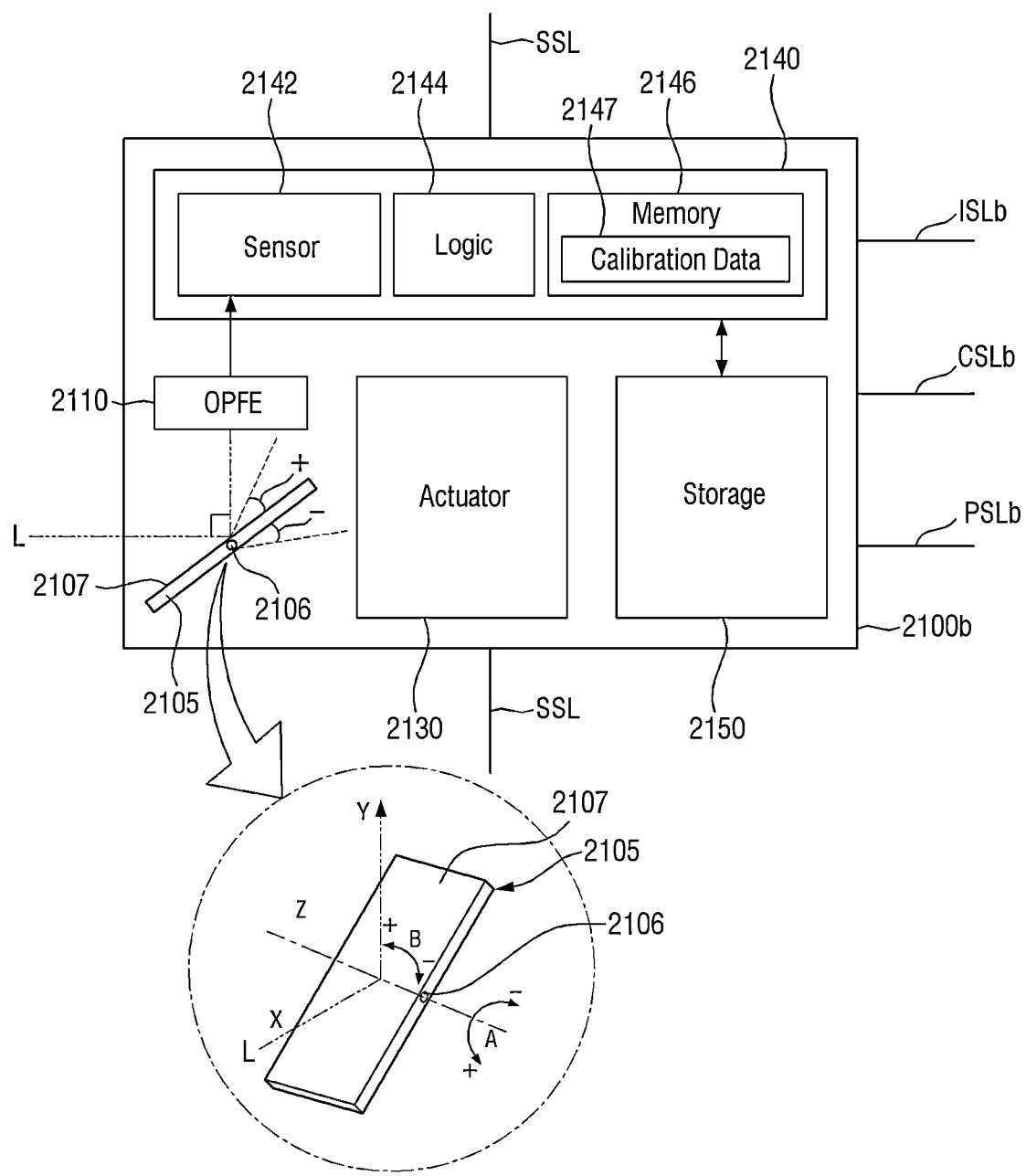
FIG. 19 is a detailed block diagram of the camera module of FIG. 18 according to some example embodiments.

Referring to FIG. 19, the camera module 2100b may include a prism 2105, an optical path folding element (hereinafter, "OPFE") 2110, an actuator 2130, an image sensing device 2140, and a storage device 2150.

The prism 2105 may include a reflecting surface 2107 of a light-reflecting material to change the path of light L that is incident from the outside.

In some example embodiments, the prism 2105 may change the path of light L incident in the first direction X to a second direction Y perpendicular to the first direction X. Further, the prism 2105 may rotate the reflecting surface 2107 of the light-reflecting material in a direction A around a central axis 2106 or rotate the central axis 2106 in a direction B to change the path of the light L incident in the first direction X into the vertical second direction Y. At this time, the OPFE 2110 may also move in a third direction Z (also referred to herein as a vertical direction) that is perpendicular to the first direction X and the second direction Y.

In some example embodiments, as shown, although a maximum rotation angle of the prism 2105 in the direction A is equal to or less than 15 degrees in a positive (+) direction A, and may be greater than 15 degrees in a negative (—) direction A, the example embodiments are not limited thereto.

In some example embodiments, the prism 2105 may move about 20 degrees, or between 10 and 20 degrees, or between 15 and 20 degrees in the positive (+) or negative (—) direction B. Here, a moving angle may move at the same angle in the positive (+) or negative (—) direction B, or may move to almost the same angle within the range of about 1 degree.

In some example embodiments, the prism 2105 may move the reflecting surface 2107 of the light-reflecting material in the third direction (e.g., a direction Z, also referred to as a vertical direction) parallel to an extension direction of the central axis 2106.

The OPFE 2110 may include, for example, an optical lens including m (here, m is a natural number) groups. The m lenses may move in the second direction Y to change an optical zoom ratio of the camera module 2100b. For example, when a basic optical zoom ratio of the camera module 2100b is set as Z, if the m optical lenses included in the OPFE 2110 are moved, the optical zoom ratio of the camera module 2100b may be changed to the optical zoom ratio of 3Z or 5Z or higher.

The actuator 2130 may move the OPFE 2110 or an optical lens (hereinafter, referred to as an optical lens) to a specific position. For example, the actuator 2130 may adjust the position of the optical lens so that an image sensor 2142 is located at a focal length of the optical lens for accurate sensing.

The image sensing device 2140 may include an image sensor 2142, control logic 2144 and a memory 2146. The image sensor 2142 may sense an image to be sensed, using light L provided through the optical lens. In some example embodiments, the image sensor 2142 may include the image sensor 100 described above.

The control logic 2144 may control the overall operation of the camera module 2100b. For example, the control logic 2144 may control the operation of the camera module 2100b in accordance with the control signal provided through the control signal line CSLb.

The memory 2146 may store information necessary for the operation of the camera module 2100b such as calibration data 2147. The calibration data 2147 may include information necessary for the camera module 2100b to generate image data, using the light L provided from the outside. The calibration data 2147 may include, for example, information on the degree of rotation, information on the focal length, information on the optical axis explained above, and the like. When the camera module 2100b is implemented in the form of a multi-state camera whose focal length changes depending on the position of the optical lens, the calibration data 2147 may include information about the focal length values for each position (or for each state) of the optical lens and auto focusing. Here, the memory 2146 may include a variable resistance element VR1 explained above. That is, the memory 2146 may include a memory cell MC including the variable resistance element VR1.

The storage device 2150 may store the image data sensed through the image sensor 2142. The storage device 2150 may be placed outside the image sensing device 2140, and may be implemented in the form of being stacked with sensor chips constituting the image sensing device 2140. In some example embodiments, although the storage device 2150 may be implemented as an EEPROM (Electrically Erasable Programmable Read-Only Memory), the example embodiments are not limited thereto. The storage device 2150 may be implemented by the lower chip 300. The storage device 2150 may include a memory cell MC including the variable resistance element VR1 described above.

Referring to FIGS. 18 and 19 together, in some example embodiments, each of the plurality of camera modules 2100a, 2100b, and 2100c may include an actuator 2130. Accordingly, each of the plurality of camera modules 2100a, 2100b, and 2100c may include calibration data 2147 that is the same as or different from each other according to the operation of the actuator 2130 included therein. As described herein, a "camera module" may be interchangeably referred to as a "camera" or "camera device."

In some example embodiments, one camera module (e.g., 2100b) among the plurality of camera modules 2100a, 2100b, and 2100c is a folded lens type camera module including the prism 2105 and the OPFE 2110 described above, and the remaining camera modules (e.g., 2100a and 2100c) may be vertical camera modules which do not include the prism 2105 and the OPFE 2110. However, the example embodiments are not limited thereto.

In some example embodiments, one camera module (e.g., 2100c) among the plurality of camera modules 2100a, 2100b, and 2100c may be a vertical depth camera which extracts depth information, for example, using an IR (Infrared Ray). In this case, the application processor 2200 may merge the image data provided from such a depth camera with the image data provided from another camera module (e.g., 2100a or 2100b) to generate a three-dimensional (3D) depth image.

In some example embodiments, at least two camera modules (e.g., 2100a and 2100c) among the plurality of camera modules 2100a, 2100b, and 2100c may have fields of view different from each other. In this case, for example, although the optical lenses of at least two camera modules (e.g., 2100a and 2100c) among the plurality of camera modules 2100a, 2100b, and 2100c may be different from each other, the example embodiments are not limited thereto.

Also, in some example embodiments, viewing angles of each of the plurality of camera modules 2100a, 2100b, and 2100c may be different from each other. In this case, although the optical lenses included in each of the plurality of camera modules 2100a, 2100b, and 2100c may also be different from each other, the example embodiments are not limited thereto.

In some example embodiments, each of the plurality of camera modules 2100a, 2100b, and 2100c may be placed to be physically separated from each other. That is, a sensing region of one image sensor 2142 is not used separately by the plurality of camera modules 2100a, 2100b, and 2100c, but the independent image sensor 2142 may be placed inside each of the plurality of camera modules 2100a, 2100b, and 2100c.

Referring to FIG. 18 again, the application processor 2200 may include an image processing device 2210, a memory controller 2220, and an internal memory 2230. The application processor 2200 may be implemented separately from the plurality of camera modules 2100a, 2100b, and 2100c. For example, the application processor 2200 and the plurality of camera modules 2100a, 2100b, and 2100c may be implemented separately as separate semiconductor chips.

The image processing device 2210 may include a plurality of sub-image processors 2212a, 2212b, and 2212c, an image generator 2214, and a camera module controller 2216.

The image processing device 2210 may include a plurality of sub-image processors 2212a, 2212b, and 2212c corresponding to the number of the plurality of camera modules 2100a, 2100b, and 2100c.

Image data generated from each of the camera modules 2100a, 2100b, and 2100c may be provided to the corresponding sub-image processors 2212a, 2212b, and 2212c through image signal lines ISLa, ISLb, and ISLc separated from each other. For example, the image data generated from the camera module 2100a is provided to the sub-image processor 2212a through an image signal line ISLa, the image data generated from the camera module 2100b is provided to the sub-image processor 2212b through an image signal line ISLb, and the image data generated from the camera module 2100c may be provided to the sub-image processor 2212c through an image signal line ISLc. Although such an image data transmission may be performed using, for example, a camera serial interface (CSI) based on a mobile industry processor interface (MIPI), the example embodiments are not limited thereto.

On the other hand, in some example embodiments, a single sub-image processor may be placed to correspond to a plurality of camera modules. For example, the sub-image processor 2212a and the sub-image processor 2212c may not be implemented separately from each other as shown, but may be implemented by being integrated as a single sub-image processor. The image data provided from the camera module 2100a and the camera module 2100c may be selected through a selection element (e.g., a multiplexer) or the like, and then provided to an integrated sub-image processor.

The image data provided to the respective sub-image processors 2212a, 2212b, and 2212c may be provided to the image generator 2214. The image generator 2214 may generate the output image, using the image data provided from the respective sub-image processors 2212a, 2212b, and 2212c according to the image generating information or the mode signal.

Specifically, the image generator 2214 may merge at least some of the image data generated from the camera modules 2100a, 2100b, and 2100c having different viewing angles to generate the output image, in accordance with the image generating information or the mode signal. Further, the image generator 2214 may select any one of the image data generated from the camera modules 2100a, 2100b, and 2100c having different viewing angles to generate the output image, in accordance with the image generating information or the mode signal.

In some example embodiments, the image generating information may include a zoom signal (or a zoom factor). Also, in some example embodiments, the mode signal may be, for example, a signal based on the mode selected from a user.

When the image generating information is a zoom signal (a zoom factor) and each of the camera modules 2100a, 2100b, and 2100c has fields of view (viewing angles) different from each other, the image generator 2214 may perform different operations depending on the type of zoom signals. For example, when the zoom signal is a first signal, the image data output from the camera module 2100a and the image data output from the camera module 2100c are merged, and then, an output image may be generated, using the merged image signal and the image data which is not used for merging and output from the camera module 2100b. If the zoom signal is a second signal that is different from the first signal, the image generator 2214 does not merge the image data, and may select any one of the image data output from each of the camera modules 2100a, 2100b, and 2100c to generate the output image. However, the example embodiments are not limited thereto, and a method of processing the image data may be modified as much as necessary.

In some example embodiments, the image generator 2214 may receive a plurality of image data with different exposure times from at least one of the plurality of sub-image processors 2212a, 2212b and 2212c, and perform high dynamic range (HDR) processing on the plurality of image data to generate merged image data with an increased dynamic range.

The camera module controller 2216 may provide the control signal to each of the camera modules 2100a, 2100b, and 2100c. The control signals generated from the camera module controller 2216 may be provided to the corresponding camera modules 2100a, 2100b, and 2100c through the control signal lines CSLa, CSLb and CSLc separated from each other.

One of the plurality of camera modules 2100a, 2100b, and 2100c is designated as a master camera (e.g., 2100a) depending on the image generating information including the zoom signal or the mode signal, and the remaining camera modules (e.g., 2100b and 2100c) may be designated as slave cameras. This information is included in the control signal, and may be provided to the corresponding camera modules 2100a, 2100b, and 2100c through the control signal lines CSLa, CSLb and CSLc separated from each other.

The camera modules that operate as master and slave may be changed depending on the zoom factor or the operating mode signal. For example, if the viewing angle of the camera module 2100a is wider than that of the camera module 2100c and the zoom factor exhibits a low zoom ratio, the camera module 2100c may operate as the master, and the camera module 2100a may operate as the slave. In contrast, when the zoom factor exhibits a high zoom ratio, the camera module 2100a may operate as the master and the camera module 2100c may operate as the slave.

In some example embodiments, the control signals provided from the camera module controller 2216 to the respective camera modules 2100a, 2100b, and 2100c may include a sync enable signal. For example, if the camera module 2100b is the master camera and the camera modules 2100a and 2100c are the slave cameras, the camera module controller 2216 may transmit the sync enable signal to the camera module 2100b. The camera module 2100b, which receives the sync enable signal, generates a sync signal on the basis of the received sync enable signal, and may provide the generated sync signal to the camera modules 2100a and 2100c through the sync signal line SSL. The camera module 2100b and the camera modules 2100a and 2100c may transmit the image data to the application processor 2200 in synchronization with such a sync signal.

In some example embodiments, the control signals provided from the camera module controller 2216 to the plurality of camera modules 2100a, 2100b, and 2100c may include mode information according to the mode signal. On the basis of the mode information, the plurality of camera modules 2100a, 2100b, and 2100c may operate in a first operating mode and a second operating mode in connection with the sensing speed.

The plurality of camera modules 2100a, 2100b, and 2100c may generate an image signal at a first speed in the first operating mode (for example, generate an image signal of a first frame rate), encode the image signal at a second speed higher than the first speed (for example, encode an image signal of a second frame rate higher than the first frame rate), and transmit the encoded image signal to the application processor 2200. At this time, the second speed may be 30 times or less of the first speed.

The application processor 2200 may store the received image signal, that is to say, the encoded image signal, in the internal memory 2230 provided inside or an external memory 2400 of the application processor 2200, and then read and decode the encoded image signal from the internal memory 2230 or the external memory 2400, and display image data generated on the basis of the decoded image signal. For example, the corresponding sub-processors among the plurality of sub-image processors 2212a, 2212b, and 2212c of the image processing device 2210 may perform decoding, and may also perform the image processing on the decoded image signal. For example, the image data generated on the basis of the decoded image signal may be displayed on the display 2500.

A plurality of camera modules 2100a, 2100b, and 2100c may generate image signals at a third speed lower than the first speed in the second operating mode (for example, generate an image signal of a third frame rate lower than the first frame rate), and transmit the image signal to the application processor 2200. The image signal provided to the application processor 2200 may be a non-encoded signal. The application processor 2200 may perform the image processing on the received image signal or store the image signal in the internal memory 2230 or the external memory 2400.

The PMIC 2300 may supply a power, e.g., a power supply voltage, to each of the plurality of camera modules 2100a, 2100b, and 2100c. For example, the PMIC 2300 may supply a first power to the camera module 2100a through a power signal line PSLa, supply a second power to the camera module 2100b through a power signal line PSLb, and supply a third power to the camera module 2100c through a power signal line PSLc, under the control of the application processor 2200.

The PMIC 2300 may generate power corresponding to each of the plurality of camera modules 2100a, 2100b, and 2100c and adjust the level of power, in response to a power control signal PCON from the application processor 2200. The power control signal PCON may include power adjustment signals for each operating mode of the plurality of camera modules 2100a, 2100b, and 2100c. For example, the operating mode may include a low power mode, and at this time, the power control signal PCON may include information about the camera module that operates in the low power mode and a power level to be set. The levels of powers provided to each of the plurality of camera modules 2100a, 2100b, and 2100c may be the same as or different from each other. Also, the levels of powers may be changed dynamically.

As described herein, any devices, electronic devices, modules, units, controllers, circuits, camera modules, image sensors, and/or portions thereof according to any of the example embodiments, and/or any portions thereof (including, without limitation, the image sensing device 1, image sensor 100, control register block 1110, image signal processor 900, logic region LC, readout circuit 1150, electronic device 2000, application processor 2200, image processing device 2210, image generator 2214, sub-image processors 2212a, 2212b, 2212c, camera module controller 2216, memory controller 2220, PMIC 2300, external memory 2400, internal memory 2230, image sensing device 2140, control logic 2144, image sensor 2142, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the image sensor, including the functionality and/or methods performed by some or all of any devices, electronic devices, modules, controllers, units, camera modules, image sensors, and/or portions thereof according to any of the example embodiments, and/or any portions thereof.

Any of the memories described herein, including, without limitation, internal memory 2230, external memory 2400, memory 2146, and/or storage device 2150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

In concluding the detailed description, those skilled in the art will appreciate that many variations and modifications may be made to some example embodiments without substantially departing from the principles of the present inventive concepts. Therefore, some example embodiments of the inventive concepts are used in a generic and descriptive sense only and not for purposes of limitation.

What is claimed is:
1. An image sensor, comprising:
a pixel group, wherein the pixel group includes
a first color filter;
a first photodiode, a second photodiode, and a third photodiode that are below the first color filter such that the first color filter overlaps each of the first, second, and third photodiodes in a vertical direction, wherein the first, second, and third photodiodes are arranged in a first direction that is perpendicular to the vertical direction;
a first floating diffusion configured to accumulate electric charges generated by the first photodiode;
a second floating diffusion configured to accumulate electric charges generated by the second photodiode;
a third floating diffusion configured to accumulate electric charges generated by the third photodiode;
a source follower transistor configured to output a first pixel signal based on the electric charges accumulated in at least one of the first to third floating diffusions; and
a first metal layer configured to receive the first pixel signal from the source follower transistor, wherein the first metal layer extends in a second direction intersecting the first direction,
wherein the first to third floating diffusions are arranged in the first direction.
2. The image sensor of claim 1, wherein the pixel group includes
a fourth photodiode, a fifth photodiode and a sixth photodiode that are below the first color filter such that the first color filter overlaps each of the fourth, fifth, and sixth photodiodes in the vertical direction, wherein the fourth, fifth, and sixth photodiodes are arranged in the first direction;
a fourth floating diffusion configured to accumulate electric charges generated by the fourth photodiode;
a fifth floating diffusion configured to accumulate electric charges generated by the fifth photodiode;
a sixth floating diffusion configured to accumulate electric charges generated by the sixth photodiode; and
a second metal layer configured to receive a second pixel signal based on the electric charges accumulated in at least one of the fourth to sixth floating diffusions, wherein the second metal layer extends in the second direction,
wherein the fourth to sixth floating diffusions are arranged in the first direction.
3. The image sensor of claim 2, wherein the fourth to sixth photodiodes are spaced apart from the first to third photodiodes in the second direction.
4. The image sensor of claim 2, further comprising:
a readout circuit connected to the first metal layer and the second metal layer,
wherein the readout circuit is configured to
receive the first pixel signal from the first metal layer, and perform an analog binning operation on the first pixel signal to output a first image signal, and
receive the second pixel signal from the second metal layer, and perform the analog binning operation on the second pixel signal to output a second image signal.

5. The image sensor of claim 4, wherein the readout circuit is configured to perform a digital binning operation on the first image signal and the second image signal to output a digital image signal.
6. The image sensor of claim 1, wherein the pixel group includes
a fourth photodiode and a fifth photodiode that are below the first color filter such that the first color filter overlaps each of the fourth and fifth photodiodes in the vertical direction, wherein the fourth and fifth photodiodes are arranged in the first direction and are spaced apart from the third photodiode in the first direction;
a fourth floating diffusion configured to accumulate electric charges generated by the fourth photodiode; and
a fifth floating diffusion configured to accumulate electric charges generated by the fifth photodiode,
wherein the source follower transistor is configured to output a second pixel signal based on the electric charges accumulated in at least one of the first to fifth floating diffusions,
the first metal layer is configured to receive the second pixel signal, and
the fourth and fifth floating diffusions are arranged in the first direction.
7. The image sensor of claim 1, wherein the first to third floating diffusions form a metal layer extending in the first direction.
8. The image sensor of claim 1, wherein the pixel group includes first to third microlenses on the first color filter, wherein the first to third microlenses each cover a separate photodiode of the first to third photodiodes.
9. The image sensor of claim 1, further comprising:
a row line connected to a gate of the source follower transistor,
wherein the row line extends in the first direction.
10. An image sensor, comprising:
a first pixel group which includes a first color filter, and first pixels below the first color filter in a form of N×M along a first direction and a second direction such that the first color filter overlaps the first pixels in a vertical direction;
a first floating diffusion shared by at least a portion of the first pixels that are arranged in the first direction, the first floating diffusion extending in the first direction and overlapped by the portion of the first pixels; and
a first column line which is connected to the first pixel group, wherein the first column line extends in the second direction, and the first column line is configured to receive a first pixel signal based on an amount of electric charges accumulated in the first floating diffusion,
wherein the first direction intersects the second direction, and
N and M are separate integers that are each 3 or more.
11. The image sensor of claim 10, further comprising:
a second pixel group which includes a second color filter configured to selectively transmit a color different from the first color filter, and second pixels below the second color filter in a form of N×M along the first direction and the second direction such that the second color filter overlaps the second pixels in the vertical direction; and
a second floating diffusion shared by at least a portion of the second pixels that are arranged in the first direction,
wherein the second pixel group is offset from the first pixel group in the second direction, wherein the first column line is configured to receive a second pixel signal based on the amount of electric charges accumulated in the second floating diffusion.

12. The image sensor of claim 11, further comprising:
a readout circuit which is connected to the first pixel group and the second pixel group and is configured to simultaneously receive the first and second pixel signals.

13. The image sensor of claim 11, further comprising:
a third pixel group which includes a third color filter configured to selectively transmit a color different from colors that the first and second color filters are collectively configured to selectively transmit, and third pixels below the third color filter in a form) of N×M along the first direction and the second direction such that the third color filter overlaps the third pixels in the vertical direction;
a third floating diffusion shared by at least a portion of the third pixels arranged in the first direction; and
a second column line which is connected to the third pixel group, extends in the second direction, and receives a third pixel signal based on the amount of electric charges accumulated in the third floating diffusion,
wherein the third pixel group is offset from the first pixel group in the first direction.

14. The image sensor of claim 13, further comprising:
a fourth pixel group which includes a fourth color filter configured to selectively transmit a color different from colors that the second and third color filters are collectively configured to selectively transmit, and fourth pixels below the fourth color filter in a form of N×M along the first direction and the second direction such that the fourth color filter overlaps the fourth pixels in the vertical direction; and
a fourth floating diffusion shared by at least a portion of the fourth pixels arranged in the first direction,
wherein the fourth pixel group is offset from the third pixel group in the second direction, and
the second column line is configured to receive a fourth pixel signal based on the amount of electric charges accumulated in the fourth floating diffusion.

15. The image sensor of claim 14, wherein the first to fourth color filters are configured to selectively transmit one of red light, green light, blue light, or white light.

16. The image sensor of claim 11, wherein
the first pixel group and the second pixel group are separated by a pixel isolation pattern as a boundary, and
the pixel isolation pattern extends in the first direction.

17. An image sensing system, comprising:
an image sensor which includes a pixel group and a readout circuit connected to the pixel group; and
an image signal processor connected to the image sensor, wherein the pixel group includes
a first color filter,
a first photodiode, a second photodiode, and a third photodiode that are below the first color filter such that the first color filter overlaps each of the first, second, and third photodiodes in a vertical direction, wherein the first, second, and third photodiodes are arranged in a first direction that is perpendicular to the vertical direction,
a first floating diffusion configured to accumulate electric charges generated by the first photodiode,
a second floating diffusion configured to accumulate electric charges generated by the second photodiode,
a third floating diffusion configured to accumulate electric charges generated by the third photodiode,
a source follower transistor configured to output a first pixel signal based on the electric charges accumulated in at least one of the first to third floating diffusions, and
a first metal layer configured to receive the first pixel signal from the source follower transistor, wherein the first metal layer extends in a second direction intersecting the first direction,
wherein the first to third floating diffusions are arranged in the first direction,
wherein the readout circuit is configured to perform an analog binning operation on the first pixel signal received from the first metal layer to output a first image signal, and
wherein the image signal processor is configured to perform a digital binning operation on the first image signal received from the readout circuit to output a second image signal.

18. The image sensing system of claim 17, wherein the pixel group includes
a fourth photodiode and a fifth photodiode that are below the first color filter such that the first color filter overlaps each of the fourth and fifth photodiodes in the vertical direction, wherein the fourth and fifth photodiodes are arranged in the first direction and are spaced apart from the third photodiode in the first direction;
a fourth floating diffusion configured to accumulate electric charges generated by the fourth photodiode; and
a fifth floating diffusion configured to accumulate electric charges generated by the fifth photodiode,
wherein the source follower transistor is configured to output a second pixel signal based on the electric charges accumulated in at least one of the first to fifth floating diffusions,
the first metal layer is configured to receive the second pixel signal, and
the fourth and fifth floating diffusions are arranged in the first direction.

19. The image sensing system of claim 17, wherein the first to third floating diffusions form a metal layer extending in the first direction.

* * * * *